(12) United States Patent
Misaki

(10) Patent No.: US 9,069,219 B2
(45) Date of Patent: Jun. 30, 2015

(54) THIN FILM TRANSISTOR SUBSTRATE AND LIQUID CRYSTAL DISPLAY DEVICE PROVIDED WITH SAME

(75) Inventor: Katsunori Misaki, Yonago (JP)

(73) Assignee: Sharp Kabushiki Kaisha, Osaka (JP)

( * ) Notice: Subject to any disclaimer, the term of this patent is extended or adjusted under 35 U.S.C. 154(b) by 94 days.

(21) Appl. No.: 13/814,022

(22) PCT Filed: May 27, 2011

(86) PCT No.: PCT/JP2011/002959
§ 371 (c)(1),
(2), (4) Date: Feb. 22, 2013

(87) PCT Pub. No.: WO2012/020525
PCT Pub. Date: Feb. 16, 2012

(65) Prior Publication Data
US 2013/0201420 A1    Aug. 8, 2013

(30) Foreign Application Priority Data

Aug. 7, 2010    (JP) .................................. 2010-178226

(51) Int. Cl.
| | | |
|---|---|---|
| G02F 1/1362 | (2006.01) | |
| H01L 29/786 | (2006.01) | |
| H01L 27/12 | (2006.01) | |
| H01L 29/417 | (2006.01) | |
| H01L 29/45 | (2006.01) | |

(52) U.S. Cl.
CPC ...... *G02F 1/136227* (2013.01); *H01L 27/1225* (2013.01); *H01L 29/41733* (2013.01); *H01L 29/458* (2013.01); *H01L 29/7869* (2013.01); *G02F 1/136286* (2013.01); *G02F 2001/136295* (2013.01); *H01L 27/124* (2013.01)

(58) Field of Classification Search
CPC ..................... H01L 27/1225; H01L 29/41733; H01L 29/458; H01L 27/124; H01L 29/7869; G02F 1/136286; G02F 2001/136295; G02F 2001/136227
USPC ........... 349/43, 139, 147, 148; 257/43, 59, 72
See application file for complete search history.

(56) References Cited

U.S. PATENT DOCUMENTS

| | | |
|---|---|---|
| 2006/0043447 A1 | 3/2006 | Ishii et al. |
| 2008/0035920 A1 | 2/2008 | Takechi et al. |
| 2008/0035930 A1 | 2/2008 | Nishiura et al. |

(Continued)

FOREIGN PATENT DOCUMENTS

| | | |
|---|---|---|
| CN | 101123259 A | 2/2008 |
| JP | 2003-149681 A | 5/2003 |

(Continued)

OTHER PUBLICATIONS

Official Communication issued in International Patent Application No. PCT/JP2011/002959, mailed on Aug. 2, 2011.

*Primary Examiner* — Dung Nguyen
*Assistant Examiner* — Tai Duong
(74) *Attorney, Agent, or Firm* — Keating & Bennett, LLP

(57) ABSTRACT

A source section (S) is made of a source metal (25s) provided above a gate insulating film (23) and an oxide semiconductor film (24a), and a drain section (DR) includes a low resistance portion (24ad) which is part of the oxide semiconductor film (24a), where the part includes a surface of the oxide semiconductor film (24a) opposite to the gate insulating film (23), and the resistance of the part is reduced.

7 Claims, 21 Drawing Sheets

(56) References Cited

U.S. PATENT DOCUMENTS

| | | |
|---|---|---|
| 2010/0072467 A1 | 3/2010 | Yamazaki et al. |
| 2010/0127266 A1 | 5/2010 | Saito et al. |
| 2010/0134397 A1 | 6/2010 | Ishitani et al. |
| 2010/0140612 A1 | 6/2010 | Omura et al. |
| 2010/0207118 A1* | 8/2010 | Sakata et al. ............. 257/43 |
| 2011/0042670 A1 | 2/2011 | Sato et al. |
| 2011/0148846 A1* | 6/2011 | Arasawa et al. ........... 345/212 |
| 2011/0240998 A1* | 10/2011 | Morosawa et al. ......... 257/57 |

FOREIGN PATENT DOCUMENTS

| | | |
|---|---|---|
| JP | 2003-163223 A | 6/2003 |
| JP | 2006-100760 A | 4/2006 |
| JP | 2008-040343 A | 2/2008 |
| JP | 2009-010362 A | 1/2009 |
| JP | 2009-272427 A | 11/2009 |
| JP | 2010-098304 A | 4/2010 |

* cited by examiner

THIN FILM TRANSISTOR SUBSTRATE AND LIQUID CRYSTAL DISPLAY DEVICE PROVIDED WITH SAME

TECHNICAL FIELD

The present invention relates to thin film transistors and to liquid crystal display devices including the thin film transistors, and specifically to a thin film transistor substrate including a thin film transistor having a semiconductor layer made of an oxide semiconductor, and to a liquid crystal display device.

BACKGROUND ART

In thin film transistor substrates included in liquid crystal display devices, thin film transistors (hereinafter also referred to as "TFTs") are used as switching elements of pixels each of which is the smallest unit of an image. Conventionally, TFTs whose semiconductor layers are made of amorphous silicon have been used. However, in recent years, instead of the TFTs including the semiconductor layers made of amorphous silicon, TFTs including oxide semiconductor films as semiconductor layers have been proposed. The TFTs including the oxide semiconductor films as the semiconductor layers exhibit satisfactory characteristics such as high mobility, high reliability, and a low off current, and thus have been actively researched and developed.

A TFT having a bottom gate structure generally includes a gate electrode provided on a glass substrate, a gate insulating film provided to cover the gate electrode, a semiconductor layer provided on the gate insulating film to overlap the gate electrode, and a source electrode included in a source section and a drain electrode included in a drain section which are provided on the gate insulating film to be spaced apart from each other and to overlap the semiconductor layer, wherein a channel section is formed in a portion of the semiconductor layer exposed between the source electrode and the drain electrode. The TFT is covered with an interlayer insulating film provided on the source electrode and the drain electrode. A contact hole extending to the drain electrode is formed in the interlayer insulating film, and an inner surface of the contact hole is covered with a pixel electrode made of a transparent conductive film, thereby electrically connecting the pixel electrode to the drain electrode.

Here, the drain electrode generally has a configuration in which a plurality of metal thin films are stacked. An example of a layered structure of the drain electrode includes a configuration in which a first conductive film made of a titanium film, a second conductive film made of an aluminum film, and a third conductive film made of a molybdenum nitride film are sequentially stacked on the gate insulating film.

In etching to form the contact hole, the contact hole is formed to extend from a surface of the interlayer insulating film to the drain electrode. The etching is performed, for example, by dry etching using a fluorine-based gas as an etching gas. Here, when the contact hole is extended to the drain electrode by the etching gas, and the contact hole passes through the third conductive film, the second conductive film (the aluminum film) is exposed in the contact hole.

When the aluminum film exposed in the contact hole is brought into contact with the etching gas, an aluminum fluoride film is formed on a surface of the aluminum film. Then, oxygen ashing is performed after the dry etching, thereby a surface of the aluminum fluoride film is oxidized, which results in that the surface of the aluminum film is covered with an aluminum oxide film containing fluorine (that is, a passivation coating).

Thus, when an ITO film, or the like is provided as the pixel electrode on the inner surface of the contact hole, the ITO film is brought into contact with the drain electrode, but part of the drain electrode which will be brought into contact with the pixel electrode is covered with the passivation coating, and thus defective conduction is caused, which may lead to quality degradation.

Patent Document 1 discloses that a channel section, a source section, and a drain section of a thin film transistor as well as a pixel electrode, and connection terminal sections at ends of a gate signal line and a source signal line are made of an identical oxide semiconductor film, all layer structures of a thin film transistor array are formed, an opening is formed at a desired location in an uppermost protective insulating film, and a plasma treatment is performed via the opening, thereby simultaneously reducing the resistance of the connection terminal sections, the source section, the drain section, and the pixel electrode to obtain the thin film transistor array.

CITATION LIST

Patent Document

PATENT DOCUMENT 1: Japanese Patent Publication No. 2008-40343

SUMMARY OF THE INVENTION

Technical Problem

However, when a thin film transistor array is formed by the method disclosed in Patent Document 1, the resistance of the entirety of the oxide semiconductor film has to be reduced, and thus the plasma treatment takes time. Moreover, the channel section is also influenced by the reduction in resistance, which causes problems such as leakage between the source and the drain, a high threshold value, etc. Moreover, the oxide semiconductor film cannot be satisfactorily protected, so that long-term reliability of the thin film transistor array may be insufficient. Moreover, since the pixel electrode is made of the oxide semiconductor film whose resistance is reduced, the resistance is high compared to the case where the pixel electrode is a transparent electrode made of an ITO film, an IZO film, or the like, so that a satisfactory display quality cannot be obtained.

It is an objective of the present invention to provide a thin film transistor substrate in which satisfactory contact is achieved between a drain section and a pixel electrode.

Solution to the Problem

A thin film transistor substrate of the present invention includes: a substrate; a thin film transistor including a gate electrode provided on the substrate, a gate insulating film provided to cover the gate electrode, an oxide semiconductor film provided on the gate insulating film and including a channel section formed at a position facing the gate electrode, and a source section and a drain section provided to be spaced apart from each other with the channel section sandwiched therebetween; a protective film which is provided to cover the thin film transistor and in which a pixel contact hole extending to the drain section is formed; and a pixel electrode provided on the protective film and electrically connected to the drain section via the pixel contact hole, wherein the source section is made of a source metal provided above the gate insulating film and the oxide semiconductor film, and the drain section is a low resistance portion which is part of the oxide semiconductor film, where the part includes a surface of the oxide semiconductor film opposite to the gate insulating film, and resistance of the part is reduced.

With this configuration, the drain section is a low resistance portion which is part of the oxide semiconductor film, where the part includes a surface of the oxide semiconductor film opposite to the gate insulating film, and the resistance of the part is reduced. Thus, there is no possibility that a contact failure occurs between pixel electrode provided on the inner surface of the pixel contact hole and the drain section.

In the thin film transistor substrate of the present invention, the low resistance portion which is the drain section preferably has a thickness of less than or equal to ½ of a thickness of the oxide semiconductor film.

The thin film transistor substrate of the present invention may further include: an interlayer insulating film provided above the gate insulating film and the oxide semiconductor film and under the protective film, wherein the source metal included in the source section is formed above the interlayer insulating film, a source contact hole extending from a surface of the interlayer insulating film to the oxide semiconductor film is formed in the interlayer insulating film, and the source metal is formed on an inner surface of the source contact hole to electrically connect the source metal to the oxide semiconductor film, and part of the oxide semiconductor film is a low resistance portion whose resistance is reduced, where the part includes a surface of the oxide semiconductor film which is in contact with the source metal.

The thin film transistor substrate of the present invention is preferably used when the source metal includes a first conductive film, and a second conductive film made of aluminum, and the first conductive film and the second conductive film are sequentially stacked on the gate insulating film.

In this case, the first conductive film may be made of a refractory metal film. Examples of the refractory metal film include: metal films such as a titanium (Ti) film, a molybdenum (Mo) film, a tantalum (Ta) film, a tungsten (W) film, a chromium (Cr) film, and a nickel (Ni) film; metal films made of nitride of these metals, alloys of these metals, etc.

In the thin film transistor substrate of the invention, the source metal further may include a third conductive film stacked on a surface of the second conductive film opposite to the first conductive film.

The thin film transistor substrate is preferably used in a liquid crystal display device, including: the thin film transistor substrate; a counter substrate arranged to face the thin film transistor substrate; and a liquid crystal layer provided between the thin film transistor substrate and the counter substrate.

Advantages of the Invention

According to the present invention, the drain section is a low resistance portion which is part of the oxide semiconductor film, where the part includes a surface of the oxide semiconductor film opposite to the gate insulating film, and the resistance of the part is reduced. Thus, there is no possibility that a contact failure occurs between the pixel electrode provided on an inner surface of the pixel contact hole and the drain section.

BRIEF DESCRIPTION OF THE DRAWINGS

FIGS. 7A-7C are views illustrating a method for fabricating the thin film transistor substrate of the first embodiment, wherein FIG. 7A is a cross-sectional view along the line A-A of FIG. 3, FIG. 7B is a cross-sectional view along the line B-B of FIG. 3, and FIG. 7C is a cross-sectional view along the line C-C of FIG. 3.

FIGS. 16A-16C are views illustrating a method for fabricating the thin film transistor substrate of the second embodiment, wherein FIG. 16A is a cross-sectional view along the line A-A of FIG. 12, FIG. 16B is a cross-sectional view along the line B-B of FIG. 12, and FIG. 16C is a cross-sectional view along the line C-C of FIG. 12.

FIGS. 24A, 24B are views illustrating a method for fabricating the thin film transistor substrate of the third embodiment, wherein FIG. 24A is a cross-sectional view along the line A-A of FIG. 21, and FIG. 24B is a cross-sectional view along the line B-B of FIG. 21.

DESCRIPTION OF EMBODIMENTS

Figure 1:
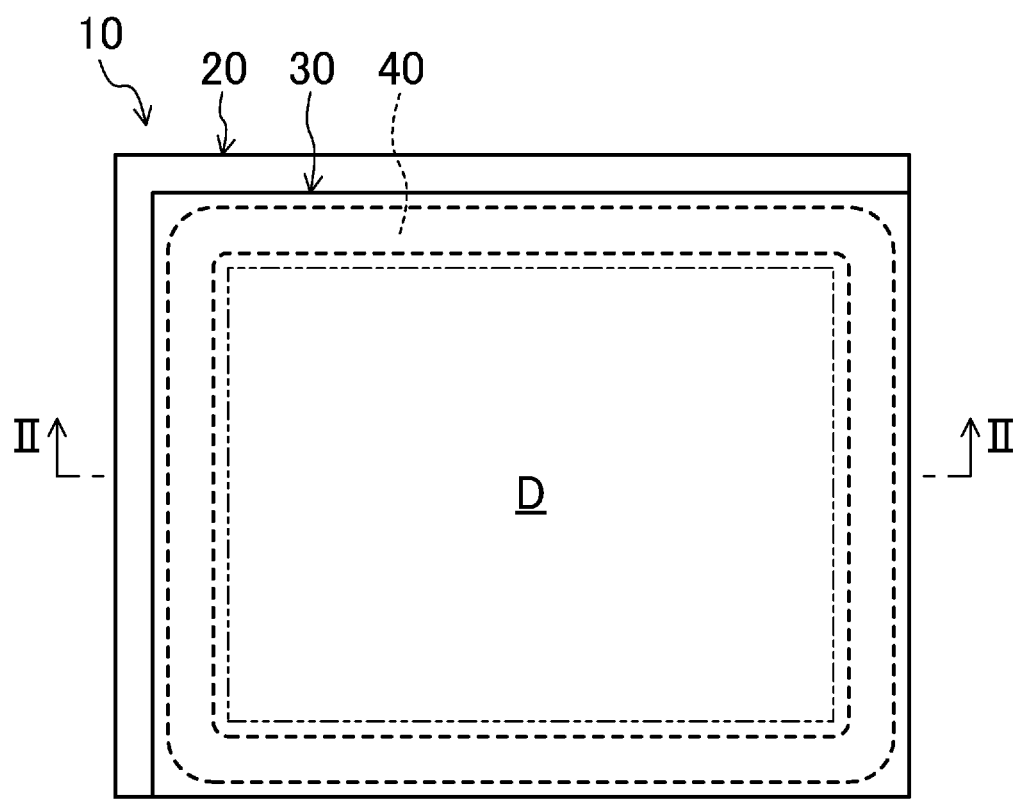
FIG. 1 is a plan view schematically illustrating a liquid crystal display device.

Embodiments of the present invention will be described in detail below with reference to the drawings. The following embodiments are not intended to limit the present invention. In the embodiments, the same reference numerals are used to represent equivalent elements.

First Embodiment

Configuration of Liquid Crystal Display Device

Figure 2:
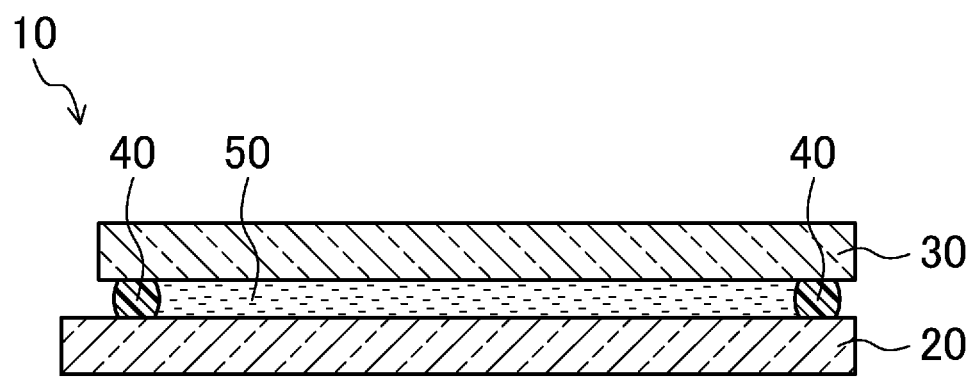
FIG. 2 is a cross-sectional view along the line II-II of FIG. 1.

FIGS. 1 and 2 illustrate a liquid crystal display device 10 according to a first embodiment. The liquid crystal display device 10 includes a TFT substrate 20 and a counter substrate 30 which are arranged to face each other. The substrates 20 and 30 are adhered to each other by a sealing material 40 provided to have a frame-like shape at outer peripheral parts of the substrates 20 and 30. In the space surrounded by the sealing material 40 between the substrates 20 and 30, a liquid crystal layer 50 is provided as a display layer. The liquid crystal display device 10 has a display region D which is surrounded by the sealing material 40 and in which a plurality of pixels are arranged in a matrix pattern. A region by which the display region D is surrounded is a picture-frame region.

(TFT Substrate)

Figure 3:
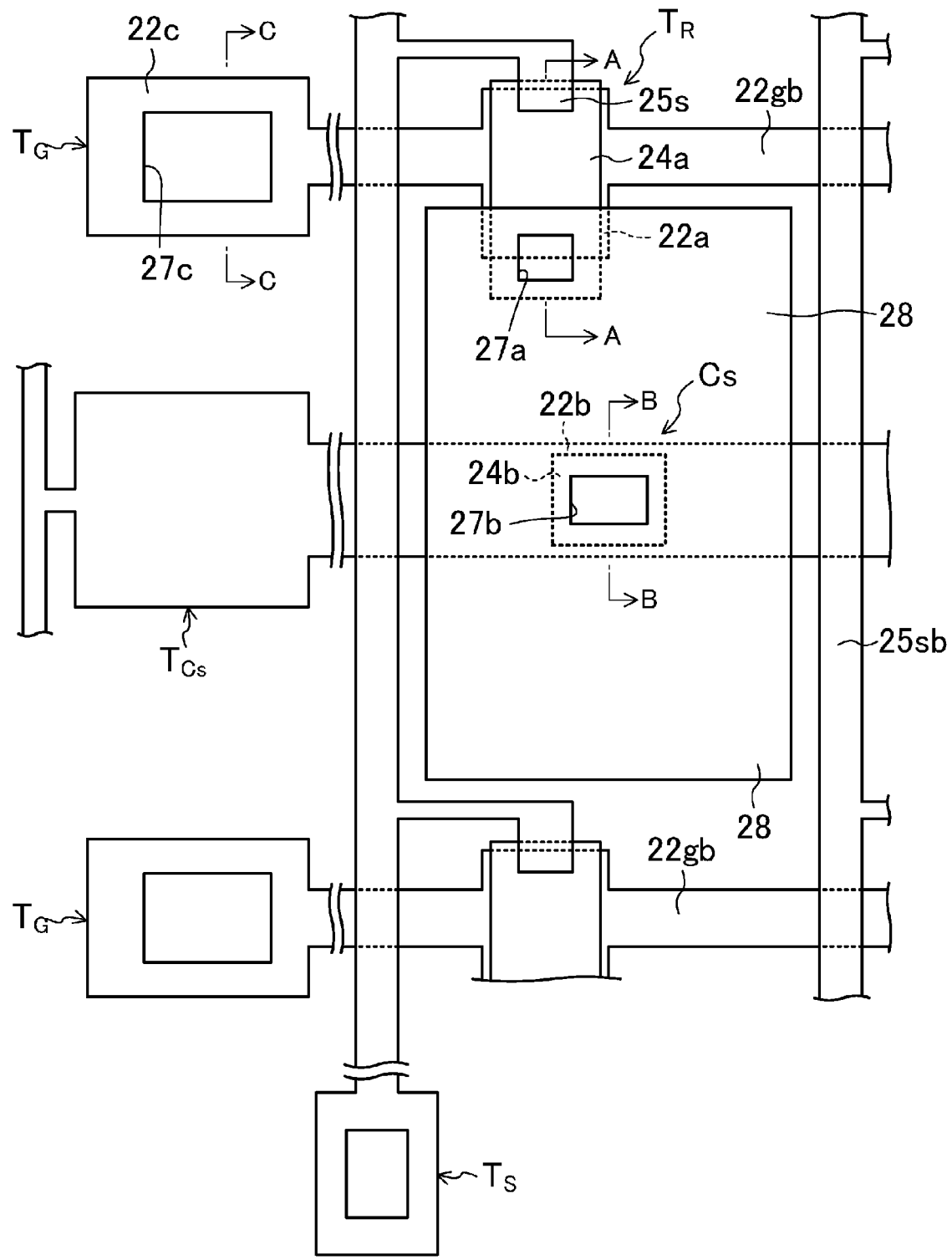
FIG. 3 is a plan view illustrating a substantial portion of the thin film transistor substrate according to the first embodiment in an enlarged manner.

FIGS. 3-6 illustrate the TFT substrate 20 of the first embodiment. FIG. 3 is a plan view illustrating the TFT substrate 20. The TFT substrate 20 is formed by stacking, on a substrate 21 made of, for example, a glass substrate, a first metal of which a gate electrode 22a, a lower electrode 22b, a terminal 22c, a gate line 22gb, transfer pads (not shown), etc. are made; a gate insulating film 23 made of $SiO_2$, a multilayer structure of $SiO_2$ and SiN, or the like; oxide semiconductor films 24a, 24b made of an IGZO film, or the like; a second metal of which a source metal 25s, a source line 25sb, etc. forming a source section are made; a protective film 26 made of $SiO_2$, SiN, a transparent insulating resin, or the like; a pixel electrode 28 made of an indium tin oxide (ITO) film, or the like; and an alignment layer (not shown) made of a polyimide film, or the like.

The TFT substrate 20 is formed such that part of the picture-frame region of the TFT substrate 20 protrudes beyond the counter substrate 30, thereby forming a terminal region to which external connection terminals (not shown) of mounted components, etc. are attached. In the picture-frame region, the transfer pads (not shown) via which a common potential is applied to a common electrode of the counter substrate 30 are formed, and each transfer pad is connected to a transfer bus line (not shown) arranged in the terminal region.

Note that a polarizing plate (not shown) is provided on a surface of the TFT substrate 20 opposite to the liquid crystal layer 50.

Figure 4:
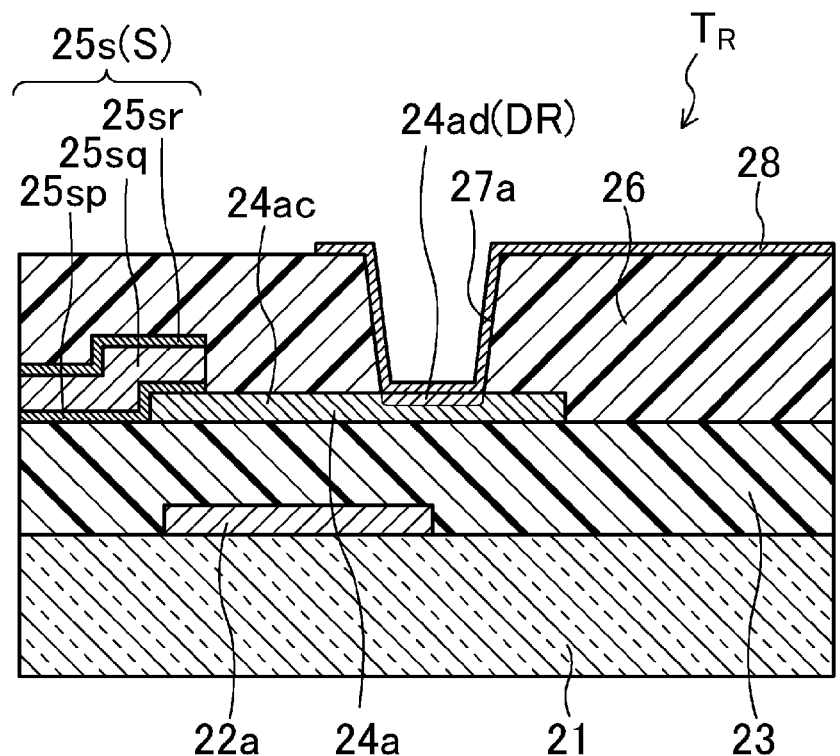
FIG. 4 is a cross-sectional view along the line A-A of FIG. 3.

FIG. 4 is a cross-sectional view along the line A-A of FIG. 3.

As illustrated in FIG. 4, the gate electrode 22a is covered with the gate insulating film 23, and on the gate insulating film 23, the oxide semiconductor film 24a including a channel section 24ac formed at a position facing the gate electrode 22a is provided, and on the oxide semiconductor film 24a, a source section S and a drain section DR are provided to be spaced apart from each other with the channel section 24ac sandwiched therebetween. These components are included in a thin film transistor $T_R$.

The gate electrode 22a is made of the first metal, and includes for example, an aluminum film, a titanium film, and a titanium nitride film which are sequentially stacked from bottom to top.

The source section S is made of the source metal 25s (the second metal) provided above the gate insulating film 23 and the oxide semiconductor film 24a.

The source metal 25s includes a first conductive film 25sp, a second conductive film 25sq, and a third conductive film 25sr which are sequentially stacked. The first conductive film 25sp is made of, for example, a titanium (Ti) film, and has a thickness of, for example, 50 nm. The second conductive film 25sq is made of, for example, an aluminum film, and has a thickness of, for example, 100 nm. The third conductive film 25sr is made of, for example, a refractory metal film such as a molybdenum nitride (MoN) film, and has a thickness of, for example, 150 nm.

The drain section DR is a low resistance portion 24ad. The low resistance portion 24ad is a portion including part of the oxide semiconductor film 24a which is exposed in a pixel contact hole 27a, and the resistance of the portion is reduced.

The low resistance portion 24ad is the portion including the part of the oxide semiconductor film 24a which is exposed in the pixel contact hole 27a, and the resistance of the portion is reduced, and thus the portion has high conductivity leading to a resistivity of about $1/10000000000$ to $1/100$ of the resistivity of the channel section 24ac. The low resistance portion 24ad includes a surface of the oxide semiconductor film 24a, and preferably has a thickness of less than or equal to ½ of the thickness of the oxide semiconductor film 24a. The resistance value of the low resistance portion 24ad is not uniform, but for example, the resistance gradually increases from the surface of the oxide semiconductor film 24a toward the gate insulating film 23. Moreover, in FIG. 4, the low resistance portion 24ad is illustrated as a discrete portion defined by a line frame for convenience, but the low resistance portion 24ad is not necessarily a discrete portion as long as it is a portion of a region integrated with the oxide semiconductor film 24a.

The pixel contact hole 27a is formed in the protective film 26, and extends from a surface of the protective film 26 to the low resistance portion 24ad of the oxide semiconductor film 24a. An inner surface of the pixel contact hole 27a is covered with the pixel electrode 28, and the pixel electrode 28 is electrically connected to the low resistance portion 24ad which is the drain section DR.

Figure 5:
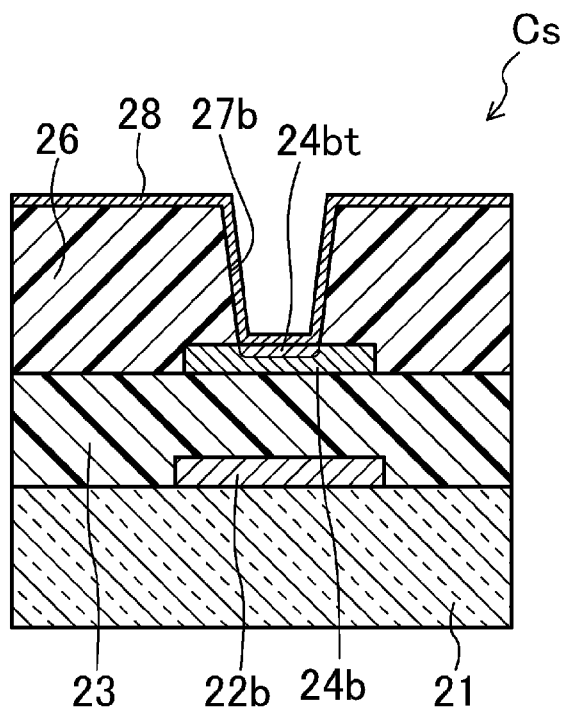
FIG. 5 is a cross-sectional view along the line B-B of FIG. 3.

FIG. 5 is a cross-sectional view along the line B-B of FIG. 3.

As illustrated in FIG. 5, the lower electrode 22b is covered with the gate insulating film 23, and on the gate insulating film 23, an etch stopper layer 24b made of an oxide semiconductor is provided at a position facing the lower electrode 22b. In the protective film 26 covering the etch stopper layer 24b, an auxiliary capacitor contact hole 27b extending to the etch stopper layer 24b is formed. A low resistance portion 24bt is formed by reducing the resistance of a portion including part of the etch stopper layer 24b which is exposed in the auxiliary capacitor contact hole 27b compared to the resistance of the other portions. These components are included in an auxiliary capacitor element Cs.

The lower electrode 22b is made of the first metal, and includes, for example, an aluminum film, a titanium film, and a titanium nitride film which are sequentially stacked from bottom to top. Note that the lower electrode 22b is connected to an auxiliary capacitor terminal $T_{Cs}$ provided in the terminal region.

An inner surface of the auxiliary capacitor contact hole 27b formed in the protective film 26 is covered with the pixel electrode 28, and the pixel electrode 28 is in contact with and electrically connected to the low resistance portion 24bt provided in the etch stopper layer 24b.

Figure 6:
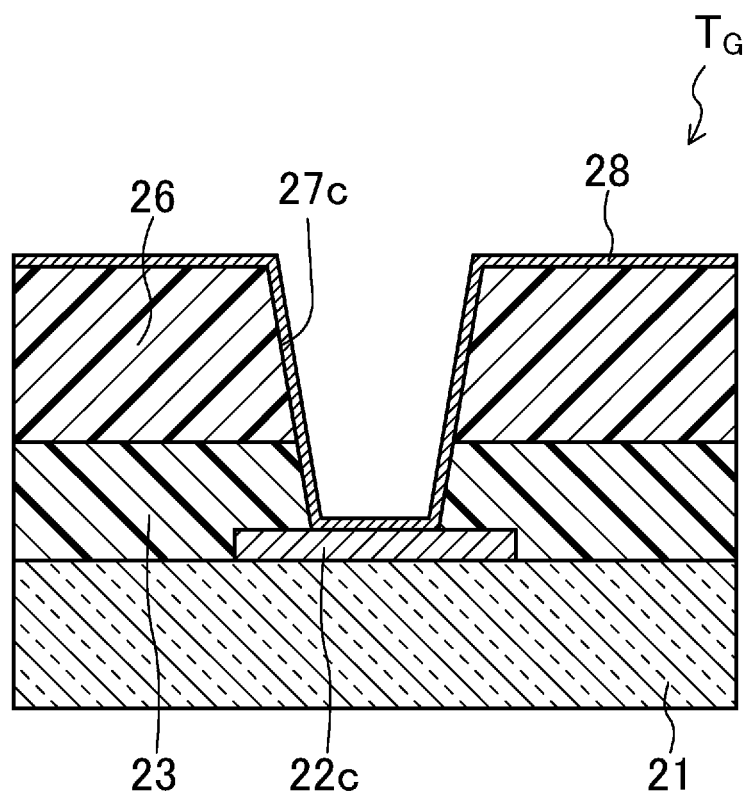
FIG. 6 is a cross-sectional view along the line C-C of FIG. 3.
Figure 7:
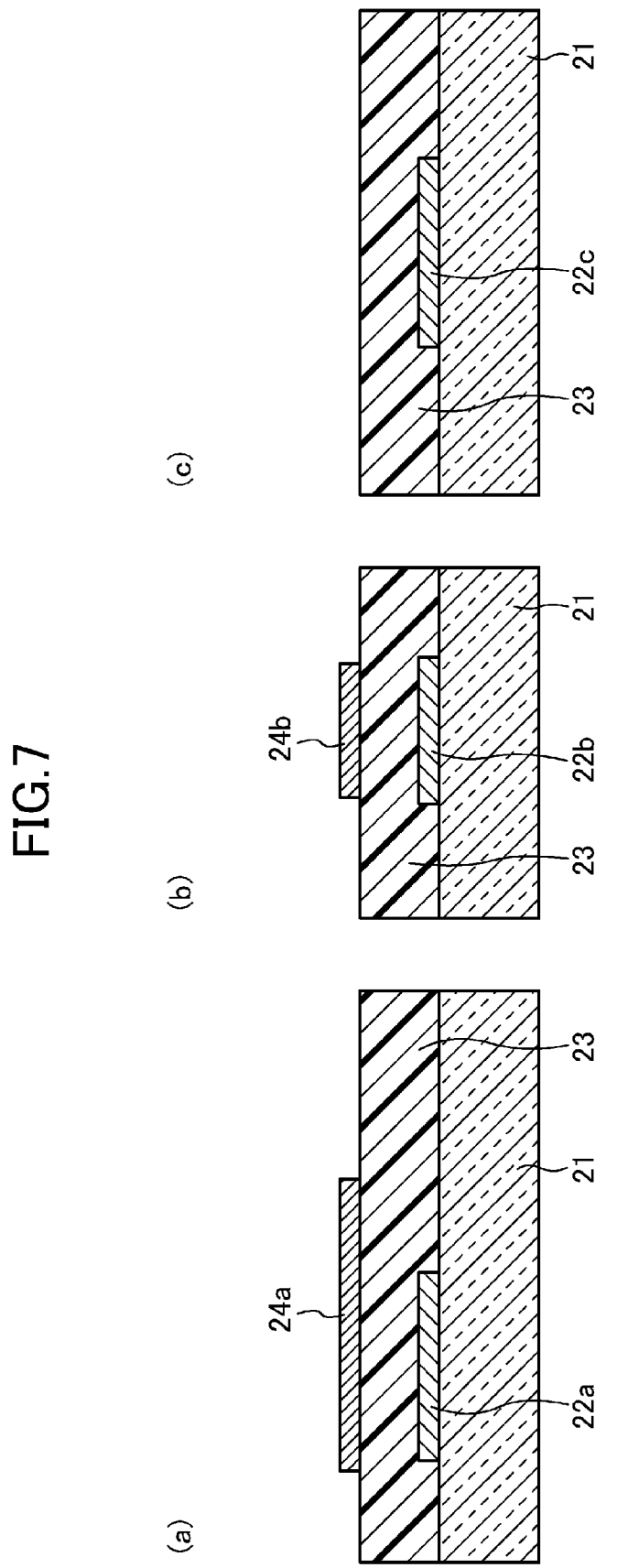
Figure 8:
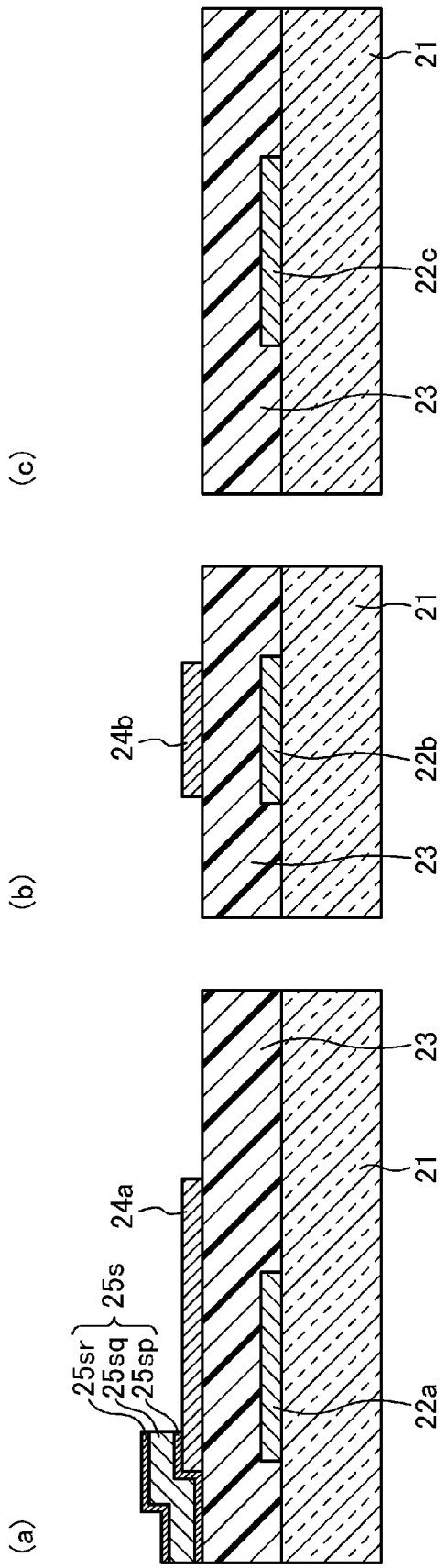
FIGS. 8A-8C are views illustrating a process step in the method for fabricating the thin film transistor substrate following the process step of FIGS. 7A-7C.
Figure 9:
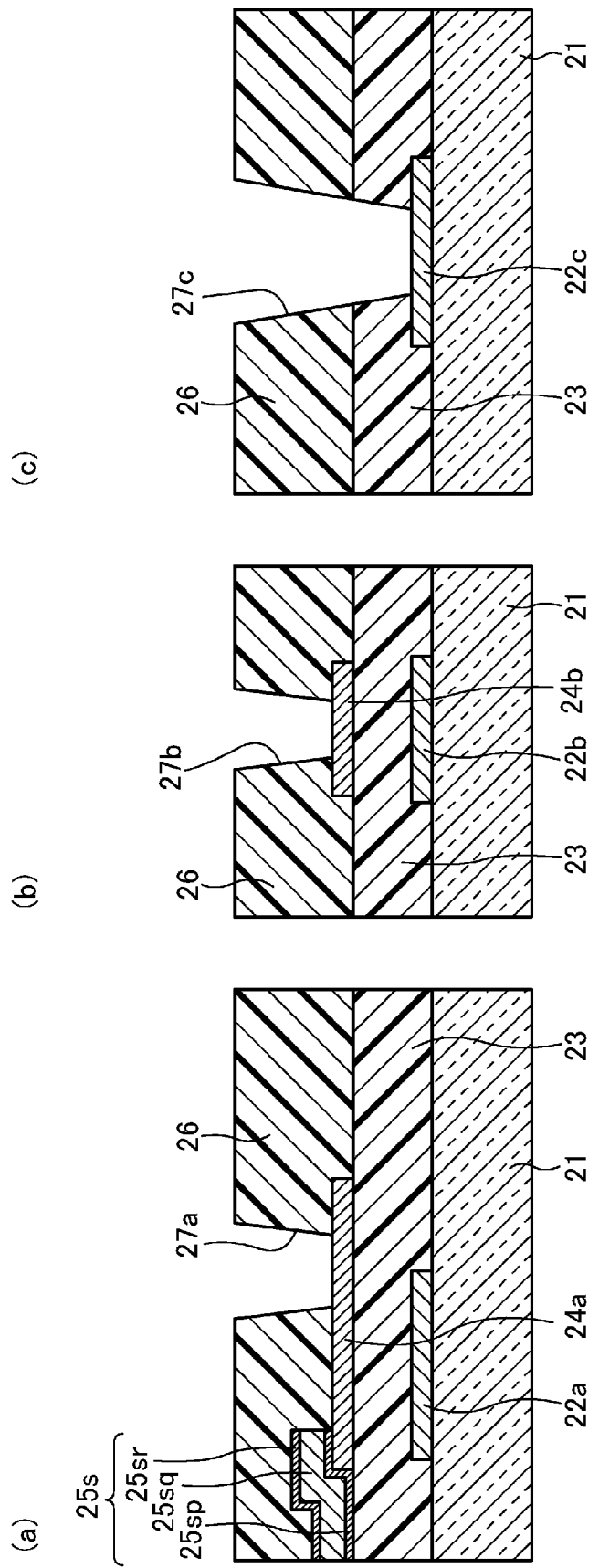
FIGS. 9A-9C are views illustrating a process step in the method for fabricating the thin film transistor substrate following the process step of FIGS. 8A-8C.
Figure 10:
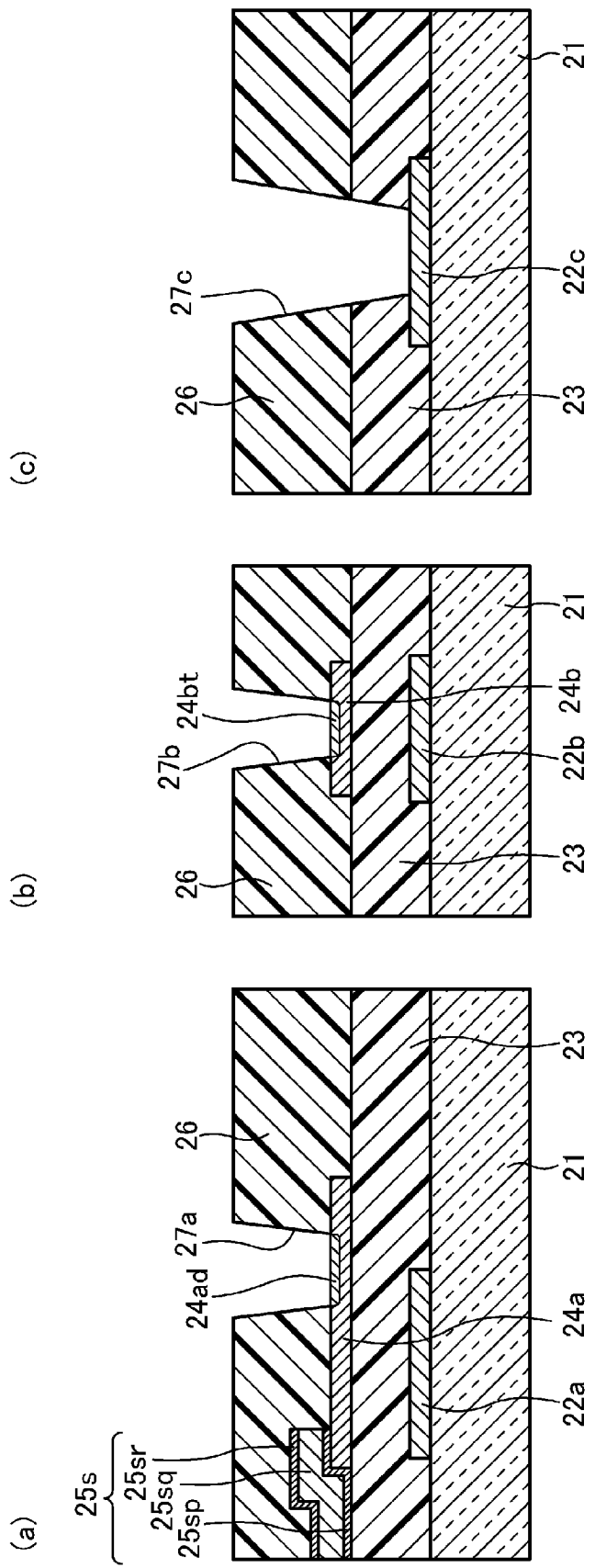
FIGS. 10A-10C are views illustrating a process step in the method for fabricating the thin film transistor substrate following the process step of FIGS. 9A-9C.
Figure 11:
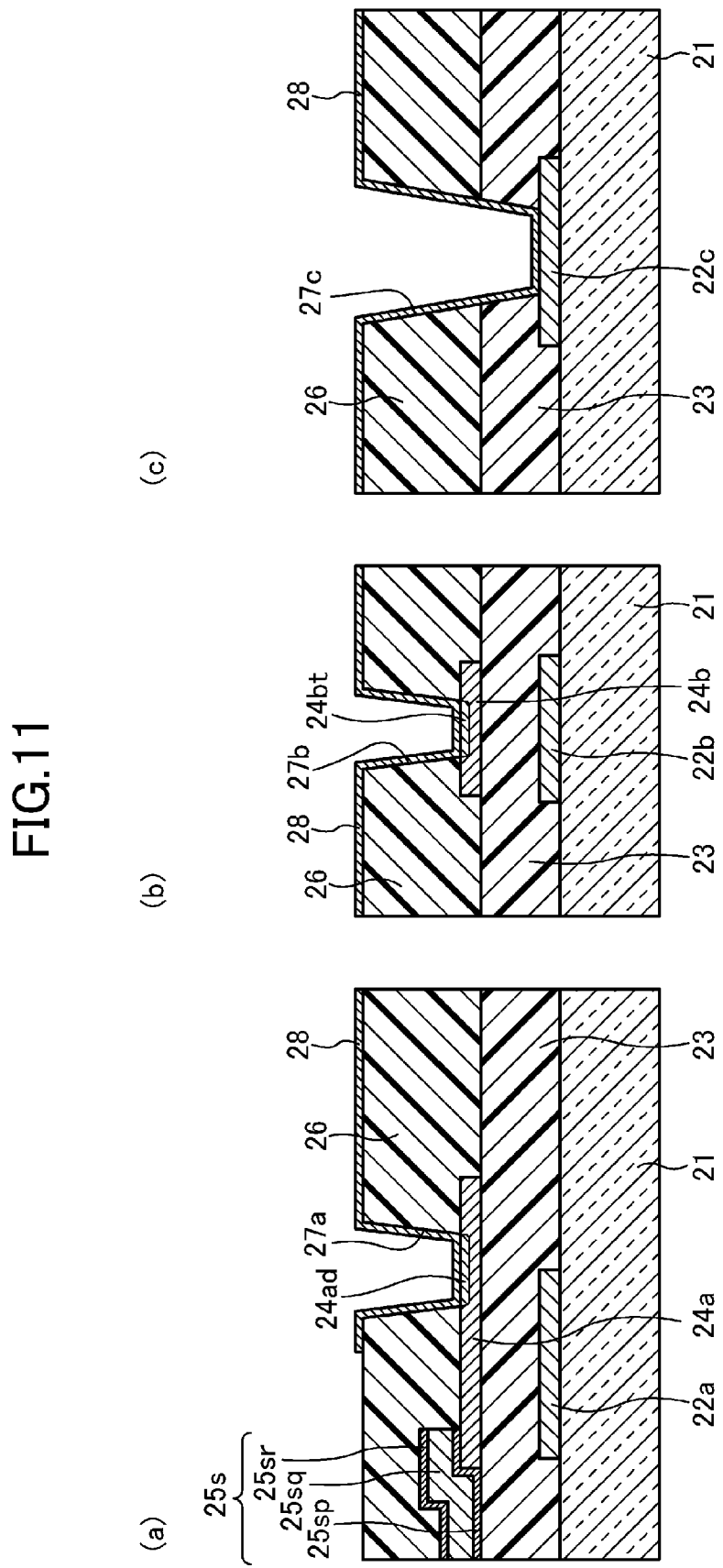
FIGS. 11A-11C are views illustrating a process step in the method for fabricating the thin film transistor substrate following the process step of FIGS. 10A-10C.

FIG. 6 is a cross-sectional view along the line C-C of FIG. 3.

As illustrated in FIG. 6, the terminal 22c is covered with the gate insulating film 23 and the protective film 26. The terminal 22c is made of the first metal, and includes, for example, an aluminum film, a titanium film, and a titanium nitride film which are sequentially stacked from bottom to top.

A contact hole 27c is formed in the gate insulating film 23 and the protective film 26 to extend from the surface of the protective film 26 to the terminal 22c. An inner surface of the contact hole 27c is covered with the pixel electrode 28, and the pixel electrode 28 is electrically connected to the terminal 22c, thereby forming a gate terminal section $T_G$.

Note that FIG. 6 illustrates a cross section of the gate terminal section $T_G$, but a source terminal section $T_S$ also has a similar cross-sectional structure.

(Counter Substrate)

Although not illustrated, on a surface of a substrate body of the counter substrate 30, each of colored layers including red, green, and blue layers 22R, 22G, 22B are provided to a different pixel in the display region D. Moreover, the common electrode, which has a thickness of, for example, 100 nm, and is made of ITO, or the like, is provided above the colored layers 22R, 22G, 22B. Further, an alignment layer is formed to cover the common electrode. The colored layers described above include three types of layers, that is, the red, green, and blue layers. However, the colored layers are not limited to these layers, but may include, for example, four types of layers: red, green, blue, and yellow layers.

Note that a polarizing plate (not shown) is provided on a surface of the counter substrate 30 opposite to the liquid crystal layer 50.

(Sealing Material)

At the outer peripheral parts of the TFT substrate 20 and the counter substrate 30, the sealing material 40 is provided to have the shape of a ring along the picture-frame region. The TFT substrate 20 and the counter substrate 30 are adhered to each other by the sealing material 40.

The sealing material 40 is obtained by curing a starting material of the sealing material by heating or by ultraviolet irradiation, where the starting material contains an adhesive of a thermosetting resin, an ultraviolet curable resin, etc. having flowability (e.g., an acryl-based resin and an epoxy-based resin) as a main component. The sealing material 40 includes, for example, conductive beads mixed therewith, and serves as a medium by which the common electrode is electrically connected to the transfer pads.

(Liquid Crystal Layer)

The liquid crystal layer 50 is made of, for example, a nematic liquid crystal material having electro-optic characteristics.

The liquid crystal display device 10 having the above-described configuration is configured such that each of pixel electrodes forms a pixel, and in each pixel, when the thin film transistor $T_R$ is turned on by a gate signal sent via the gate line 22gb, a source signal is sent via the source line 25sb, so that a predetermined charge is applied to the pixel electrode 28 via the source section S (the source metal 25s) and the drain section DR (the low resistance portion 24ad), which causes a potential difference between the pixel electrode 28 and the common electrode of the counter substrate 30, thereby applying a predetermined voltage to a liquid crystal capacitor including the liquid crystal layer 50. The liquid crystal display device 10 displays an image by adjusting transmittance of light coming from the outside, based on the phenomenon that the alignment of liquid crystal molecules changes according to the magnitude of the applied voltage.

In the above description, the second metal, of which the source metal 25s, and the like of the TFT substrate 20 is made, has a configuration in which the first conductive film 25sp, the second conductive film 25sq, and the third conductive film 25sr are sequentially stacked. However, a configuration which does not include the third conductive film 25sr (that is, a configuration in which two layers, the first conductive film 25sp and the second conductive film 25sq are stacked) may be possible, or other configurations may be possible.

Moreover, in the above description, the second conductive film 25sq of the second metal, of which the source metal 25s, and the like of the TFT substrate 20 is made, is an aluminum film. However, a film made of an aluminum alloy, a film made of copper (Cu) or made of a copper alloy, etc. may be used.

<Method for Fabricating TFT Substrate>

With reference to FIGS. 7-11, a method for fabricating the TFT substrate 20 of the present embodiment will be described below.

(Formation of First Metal, Gate Insulating Film, Oxide Semiconductor Film)

First, as illustrated in FIGS. 7A-7C, a first metal is provided on a substrate 21 to form a gate electrode 22a, a lower electrode 22b, a terminal 22c, a gate line 22gb (see FIG. 3), transfer pads (not shown), etc. Specifically, an aluminum film, a titanium film, and a titanium nitride film are successively formed by, for example, sputtering. Thereafter, a resist pattern is left on portions which will be the gate electrode 22a, the lower electrode 22b, the terminal 22c, etc. by using photolithography. Then, a multilayer structure which is a conductive film composed of the aluminum film, the titanium film, and the titanium nitride film is etched by, for example, dry etching (RIE) using a chlorine-based gas. After that, the resist is removed by a resist remover solution.

Next, as a gate insulating film 23, a $SiO_2$ film is formed by, for example, CVD.

Next, an oxide semiconductor film 24a and an etch stopper layer 24b are formed. Specifically, an oxide semiconductor film such as an IGZO film is formed by, for example, sputtering, and then a resist pattern is left by photolithography on portions which will be the oxide semiconductor film 24a and the etch stopper layer 24b. Then, the IGZO film is etched by, for example, wet etching using an oxalic acid solution as an etchant. After that, the resist is removed by a resist remover solution.

(Formation of Second Metal)

Subsequently, as illustrated in FIGS. 8A-8C, a source metal 25s is formed. Specifically, a titanium film (having a thickness of about 50 nm) which will be a first conductive film 25sp, an aluminum film (having a thickness of about 150 nm) which will be a second conductive film 25sq, and a molybdenum nitride film (having a thickness of about 100 nm) which will be a third conductive film 25sr are successively formed by, for example, sputtering. Then, a resist pattern is left by photolithography on a portion which will be the source metal 25s. Then, the second conductive film and the third conductive film are etched by, for example, wet etching using a mixed acid solution of phosphoric acid/acetic acid/nitric acid as an etchant. Further, the titanium film which is the first conductive film is etched by dry etching (RIE) using a chlorine-based gas. Thereafter, the resist is removed by a resist remover solution.

(Formation of Protective Film•Contact Hole)

Next, as illustrated in FIGS. 9A-9C, a $SiO_2$ film is formed as a protective film 26 by, for example, CVD. Then, the protective film 26 is dry etched, thereby forming a pixel contact hole 27a, an auxiliary capacitor contact hole 27b, and a contact hole 27c. Specifically, first, a photosensitive resist is applied to the protective film 26. Then, the resist is left by photolithography on portions except portions which will be the contact holes 27a-27c. Then, the protective film 26 is etched by, for example, dry etching (RIE), thereby forming the contact holes 27a-27c. Here, the oxide semiconductor film 24a, the etch stopper layer 24b, and the terminal 22c serve as an etch stopper.

(Process of Reducing Resistance)

Subsequently, as illustrated in FIGS. 10A, 10B, a process of reducing resistance is performed on parts of the oxide semiconductor film 24a and the etch stopper layer 24b which are respectively exposed in the pixel contact hole 27a and the auxiliary capacitor contact hole 27b to reduce the resistance of portions including the exposed parts of the oxide semiconductor film 24a and the etch stopper layer 24b, thereby forming low resistance portions 24ad, 24bt. Examples of the process of reducing resistance include plasma treatment, vacuum annealing, etc. For example, when the process of reducing resistance is performed by plasma treatment, the plasma treatment is preferably performed under plasma treatment conditions that, for example, the hydrogen gas flow rate is 2000 sccm, the pressure is 200 Pa, the RF electric power is 1000 W, the temperature is 250° C., and the processing time is longer than or equal to 30 sec. Here, other than a hydrogen gas, a $NH_3$ gas, a $SiH_4$ gas, etc. may be used. Alternatively, for example, the plasma treatment may be performed under plasma treatment conditions that the $CF_4$ gas flow rate is 270 sccm, the $O_2$ gas flow rate is 30 scccm, the pressure is 7 Pa, the RF electric power is 1000 W, and the processing time is longer than or equal to 30 sec. Alternatively, for example, the plasma treatment may be performed under plasma treatment conditions that the $SF_6$ gas flow rate is 200 sccm, the $O_2$ gas flow rate is 200 sccm, the pressure is 8 Pa, the RF electric power is 600 W, the processing time is longer than or equal to 30 sec. Alternatively, for example, the plasma treatment is preferably performed under conditions that the $Cl_2$ gas flow rate is 80 sccm, the $BCl_3$ gas flow rate is 120 sccm, the pressure is 4 Pa, the RF electric power is 1000 W, and the processing time is longer than or equal to 30 sec. Alternatively, when the process of reducing resistance is performed by vacuum annealing, the vacuum annealing is preferably performed under vacuum annealing conditions that the temperature is higher than or equal to 250° C., the pressure is lower than or equal to 500 Pa, and the processing time is longer than or equal to 1 minute. With this process of reducing resistance, a portion having a thickness of less than or equal to ½ of the thickness of the oxide semiconductor film 24a is formed into the low resistance portion 24ad having a resistance lower than that of the oxide semiconductor film 24a. Moreover, a portion having a thickness of less than or equal to ½ of the thickness of the etch stopper layer 24b is formed into the low resistance portion 24bt having a resistance lower than that of the etch stopper layer 24b. The low resistance portion 24ad formed by reducing the resistance of part of the oxide semiconductor film 24a serves as a drain section DR. Moreover, the low resistance portion 24bt formed by reducing the resistance of part of the etch stopper layer 24b serves as an upper electrode portion of an auxiliary capacitor element Cs.

Note that in a gate terminal section $T_G$, as illustrated in FIG. 11C, the process of reducing resistance is not performed on the contact hole 27c.

(Formation of Pixel Electrode)

Finally, as illustrated in FIGS. 11A-11C, a pixel electrode 28 is formed. Specifically, first, an ITO film is formed by, for example, sputtering. Then, a resist pattern is left on a portion which will be the pixel electrode 28 by photolithography. Then, the ITO film is etched by using, for example, an oxalic acid solution as an etchant to remove the resist by a resist remover solution, thereby forming the pixel electrode 28.

As described above, the TFT substrate 20 is fabricated. The TFT substrate 20 fabricated by the above-described method and the counter substrate 30 including pixels each provided with a color filter are arranged to face each other and are adhered to each other by the sealing material 40, and a liquid crystal material is filled between the substrates, thereby forming the liquid crystal layer 50, so that the liquid crystal display device 10 can be obtained.

(Advantages of First Embodiment)

The thin film transistor $T_R$ of the present embodiment has the above-described configuration, and thus the pixel electrode 28 is directly in contact with and is electrically connected to the drain section DR, which can reduce the occurrence of a contact failure between the pixel electrode 28 and the drain section DR. In particular, when the second metal is formed to have a multilayer structure composed of a first conductive film and a second conductive film, and the second conductive film is an aluminum film, if the drain section DR is made of a drain metal, the aluminum film serving as the second conductive film is oxidized in forming the pixel contact hole 27a, and a surface of the aluminum film is covered with a passivation coating, which may cause a contact failure between the drain metal and the pixel electrode 28 provided on a surface of the pixel contact hole 27a. However, the drain section DR is made of the low resistance portion 24ad obtained by reducing the resistance of part of the oxide semiconductor film 24a. Thus, there is no possibility that the problem as described above arises, and satisfactory contact can be achieved.

Second Embodiment

Configuration of Liquid Crystal Display Device

Similar to the first embodiment, a liquid crystal display device 10 according to a second embodiment includes a TFT substrate 20 and a counter substrate 30 which are arranged to face each other. The substrates 20 and 30 are adhered to each other by a sealing material 40 provided to have a frame-like shape at outer peripheral parts of the substrates 20 and 30. In the space surrounded by the sealing material 40 between the substrates 20 and 30, a liquid crystal layer 50 is provided as a display layer. The liquid crystal display device 10 has a display region D which is surrounded by the sealing material 40 and in which a plurality of pixels are arranged in a matrix pattern. A region by which the display region D is surrounded is a picture-frame region. The configurations, etc. of the counter substrate 30, the sealing material 40, and the liquid crystal layer 50 are the same as those of the first embodiment, and thus the description thereof is omitted.

(TFT Substrate)

Figure 12:
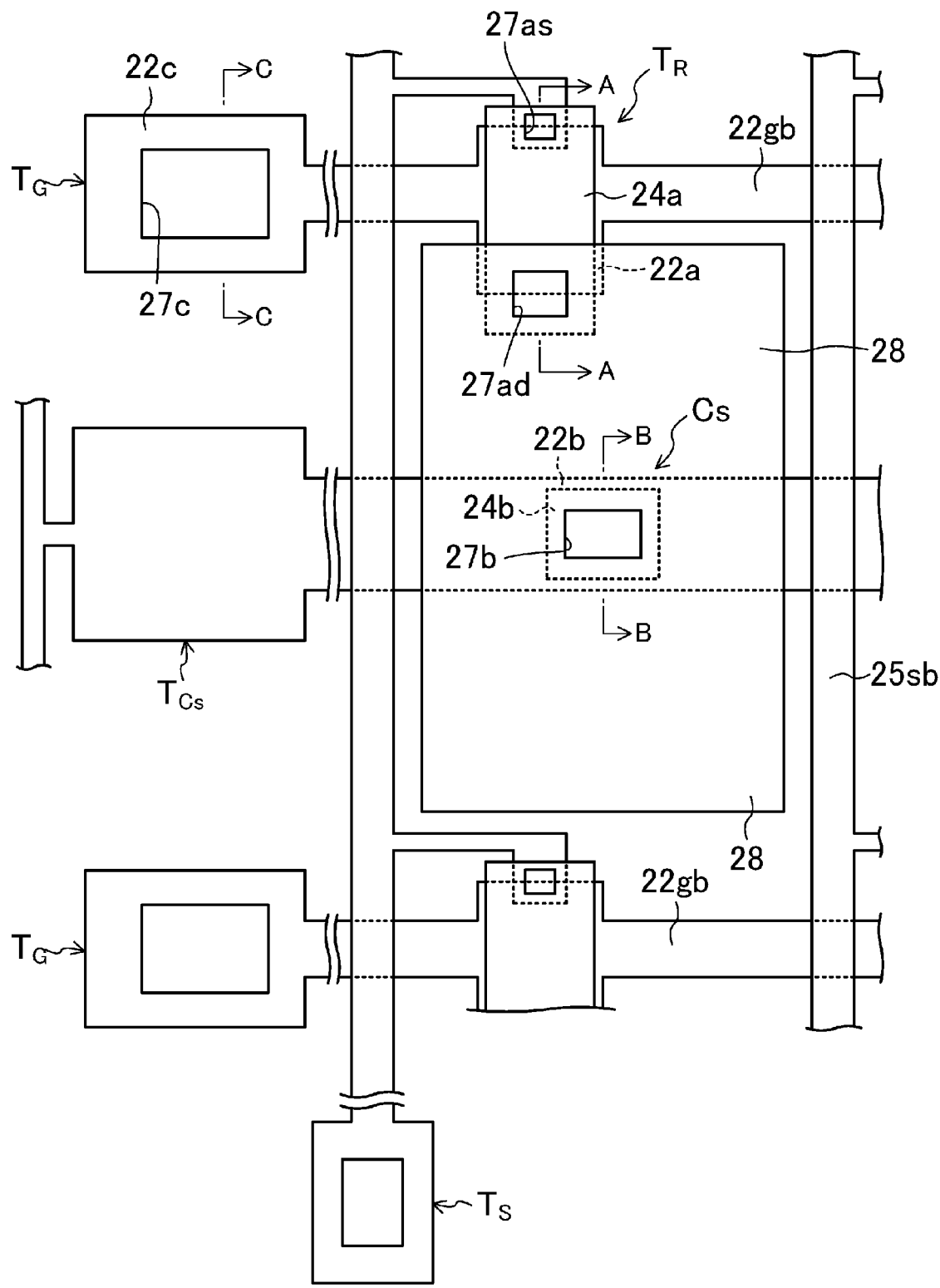
FIG. 12 is a plan view illustrating a substantial portion of a thin film transistor substrate according to a second embodiment in an enlarged manner.

FIGS. 12-15 illustrate the TFT substrate 20 of the second embodiment. FIG. 12 is a plan view illustrating the TFT substrate 20. The TFT substrate 20 is formed by stacking, on a substrate 21, a first metal (of which a gate electrode 22a, a lower electrode 22b, a terminal 22c, a gate line 22gb, and transfer pads (not shown) are made), a gate insulating film 23, oxide semiconductor films 24a, 24b, an interlayer insulating film 26A, a second metal (of which a source metal 25s and a source line 25sb are made), a protective film 26B, a pixel electrode 28, and an alignment layer (not shown).

Figure 13:
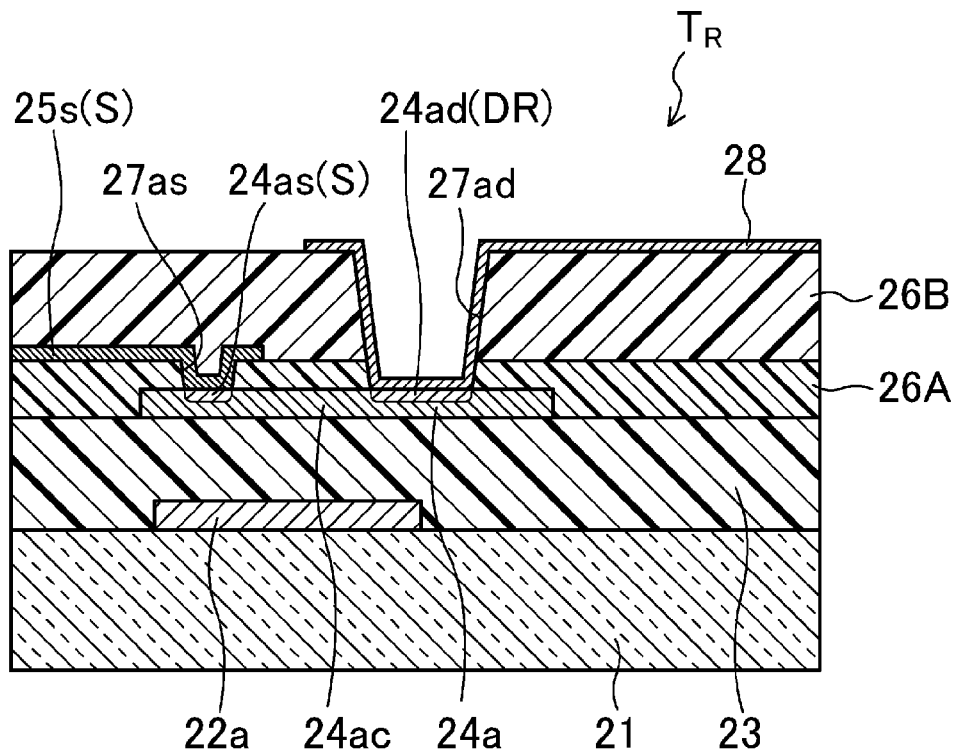
FIG. 13 is a cross-sectional view along the line A-A of FIG. 12.

FIG. 13 is a cross-sectional view along the line A-A of FIG. 12.

As illustrated in FIG. 13, the gate electrode 22a is covered with the gate insulating film 23, and on the gate insulating film 23, the oxide semiconductor film 24a including a channel section 24ac formed at a position facing the gate electrode 22a is provided, and on the oxide semiconductor film 24a, a source section S and a drain section DR are provided to be spaced apart from each other with the channel section 24ac sandwiched therebetween.

The gate electrode 22a is made of the first metal, and includes, for example, an aluminum film, a titanium film, and a titanium nitride film which are sequentially stacked from bottom to top.

The source section S includes a low resistance portion 24as obtained by reducing the resistance of a portion including part of the oxide semiconductor film 24a which is exposed in a source contact hole 27as, and the source metal 25s provided above the gate insulating film 23, the oxide semiconductor film 24a, and the interlayer insulating film 26A.

The low resistance portion 24as is a portion including the part of the oxide semiconductor film 24a which is exposed in the source contact hole 27as, and the resistance of the portion is reduced, and thus the portion has high conductivity leading to a resistivity of about $1/10000000000$ to $1/100$ of the resistivity of the channel section 24ac. The low resistance portion 24as includes a surface of the oxide semiconductor film 24a, and preferably has a thickness of less than or equal to ½ of the thickness of the oxide semiconductor film 24a. The resistance value of the low resistance portion 24as is not uniform, but for example, the resistance gradually increases from the surface of the oxide semiconductor film 24a toward the gate insulating film 23. Moreover, in FIG. 13, the low resistance portion 24as is illustrated as a discrete portion defined by a line frame for convenience, but the low resistance portion 24as is not necessarily a discrete portion as long as it is a portion of a region integrated with the oxide semiconductor film 24a.

The source metal 25s is made of the second metal, and includes, similar to the first embodiment, for example, a first conductive film 25sp, a second conductive film 25sq, and a third conductive film 25sr which are sequentially stacked.

The drain section DR is a low resistance portion 24a. The low resistance portion 24a is a portion including part of the oxide semiconductor film 24a which is exposed in a pixel contact hole 27ad, and the resistance of the portion is reduced.

The low resistance portion 24ad is the portion including the part of the oxide semiconductor film 24a which is exposed in the pixel contact hole 27ad, and the resistance of the portion is reduced, and thus the portion has high conductivity leading to a resistivity of about $1/10000000000$ to $1/100$ of the resistivity of the channel section 24ac. The low resistance portion 24ad includes a surface of the oxide semiconductor film 24a, and preferably has a thickness of less than or equal to ½ of the thickness of the oxide semiconductor film 24a. The resistance value of the low resistance portion 24ad is not uniform, but for example, the resistance gradually increases from the surface of the oxide semiconductor film 24a toward the gate insulating film 23. Moreover, in FIG. 13, the low resistance portion 24ad is illustrated as a discrete portion defined by a line frame for convenience, but the low resistance portion 24ad is not necessarily a discrete portion as long as it is a portion of a region integrated with the oxide semiconductor film 24a.

The pixel contact hole 27ad is formed in the interlayer insulating film 26A and the protective film 26B, and extends from a surface of the protective film 26B to the low resistance portion 24ad of the oxide semiconductor film 24a. An inner surface of the pixel contact hole 27ad is covered with the pixel electrode 28, and the pixel electrode 28 is electrically connected to the low resistance portion 24ad which is the drain section DR.

A thin film transistor $T_R$ of the present embodiment has the above-described configuration, and thus the pixel electrode 28 is directly in contact with and is electrically connected to the drain section DR, which can reduce the occurrence of a contact failure between the pixel electrode 28 and the drain section DR. In particular, when the second metal is formed to have a multilayer structure composed of a first conductive film, a second conductive film, and a third conductive film, and the second conductive film is an aluminum film, if the drain section DR is made of a drain metal, the aluminum film serving as the second conductive film is oxidized in forming the pixel contact hole 27ad, and a surface of the aluminum film is covered with a passivation coating, which may cause a contact failure between the drain metal and the pixel electrode 28 provided on a surface of the pixel contact hole 27ad. However, the drain section DR is made of the low resistance portion 24ad obtained by reducing the resistance of part of the oxide semiconductor film 24a. Thus, there is no possibility that the problem as described above arises, and satisfactory contact can be achieved.

Figure 14:
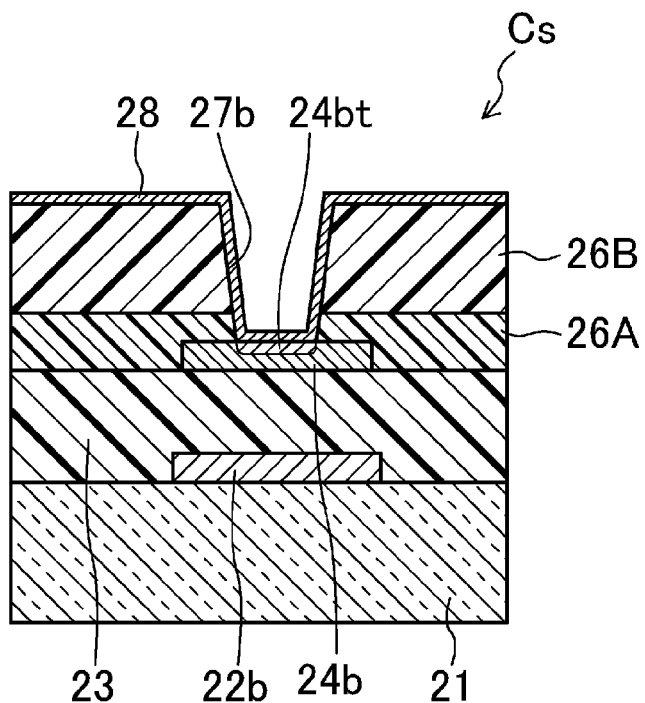
FIG. 14 is a cross-sectional view along the line B-B of FIG. 12.

FIG. 14 is a cross-sectional view along the line B-B of FIG. 12.

As illustrated in FIG. 14, the lower electrode 22b is covered with the gate insulating film 23, and on the gate insulating film 23, the etch stopper layer 24b made of an oxide semiconductor is provided at a position facing the lower electrode 22b. In the interlayer dielectric film 26A and the protective film 26 covering the etch stopper layer 24b, an auxiliary capacitor contact hole 27b extending to the etch stopper layer 24b is formed. A low resistance portion 24bt is formed by reducing the resistance of a portion including part of the etch stopper layer 24b which is exposed in the auxiliary capacitor contact hole 27b compared to the resistance of the other portions. These components are included in an auxiliary capacitor element Cs.

The lower electrode 22b is made of the first metal, and has a configuration in which, for example, an aluminum film, a titanium film, and a titanium nitride film are sequentially stacked from bottom to top. Note that the lower electrode 22b is connected to an auxiliary capacitor terminal $T_{Cs}$ provided in the terminal region.

The auxiliary capacitor contact hole 27b is formed in the interlayer insulating film 26A and the protective film 26B, and extends from the surface of the protective film 26B to the low resistance portion 24bt of the etch stopper layer 24b. An inner surface of the auxiliary capacitor contact hole 27b is covered with the pixel electrode 28, and the pixel electrode 28 is electrically connected to the low resistance portion 24bt.

Figure 15:
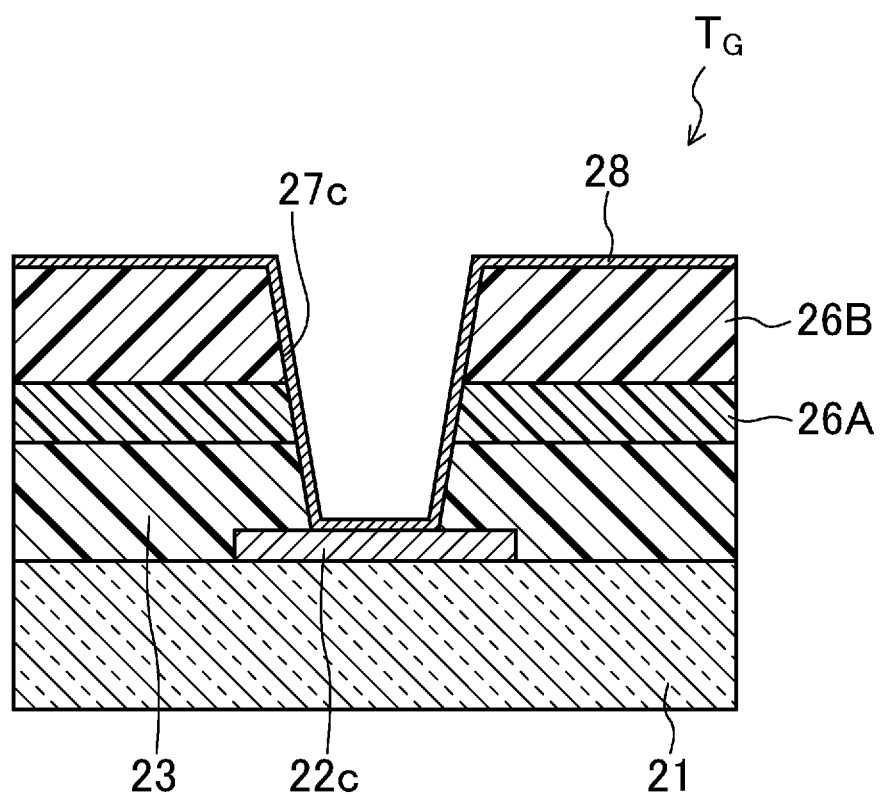
FIG. 15 is a cross-sectional view along the line C-C of FIG. 12.
Figure 16:
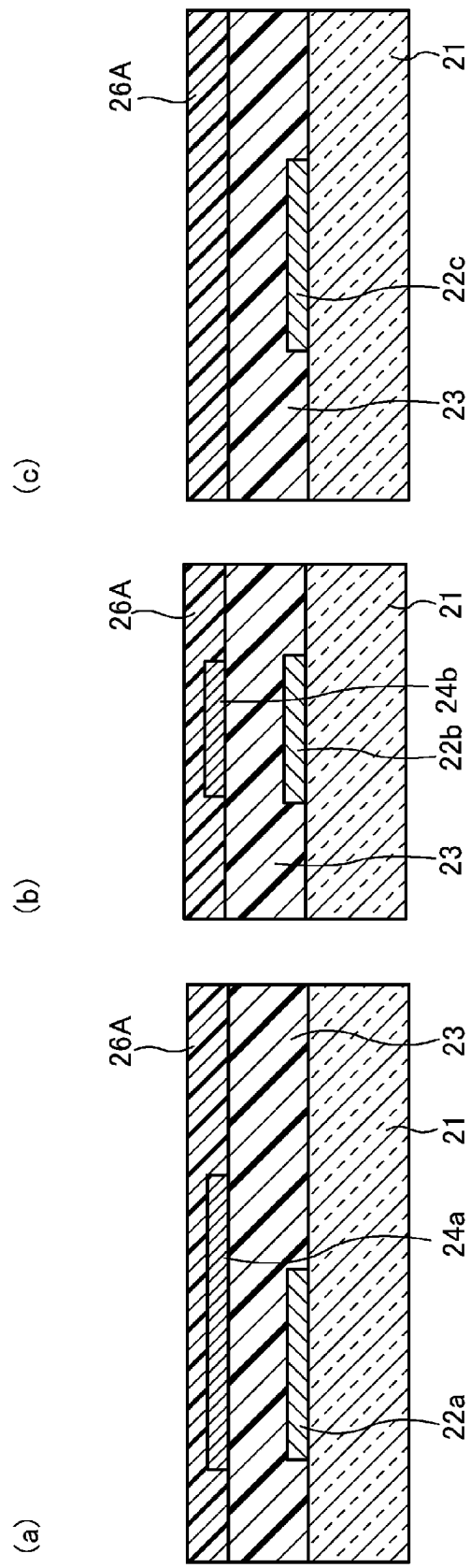
Figure 17:
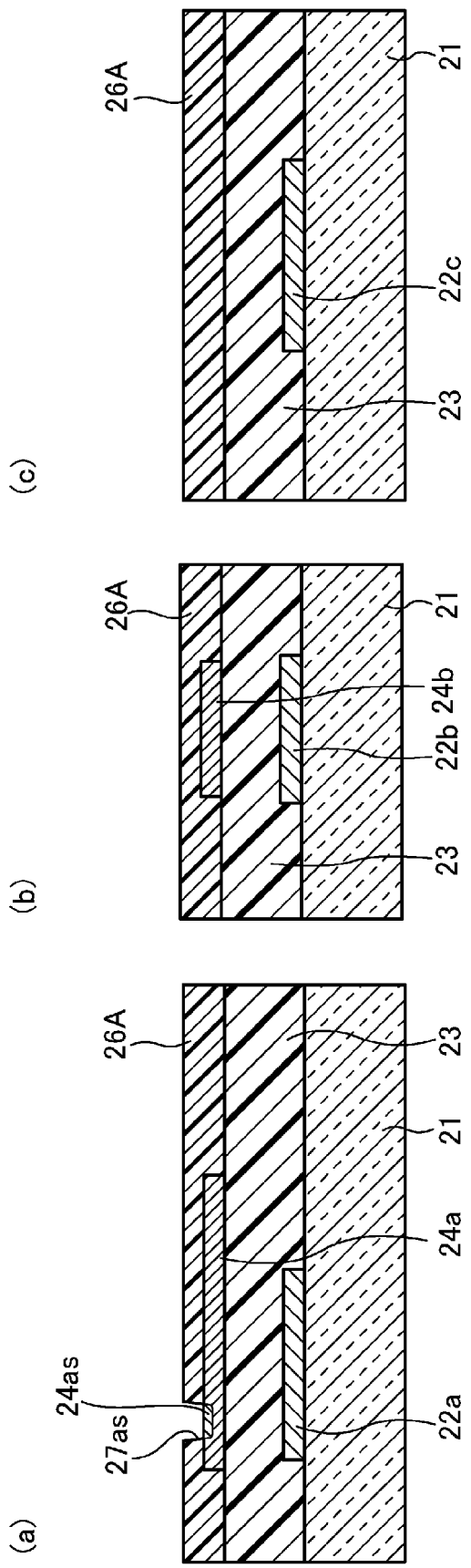
FIGS. 17A-17C are views illustrating a process step in the method for fabricating the thin film transistor substrate following the process step of FIGS. 16A-16C.
Figure 18:
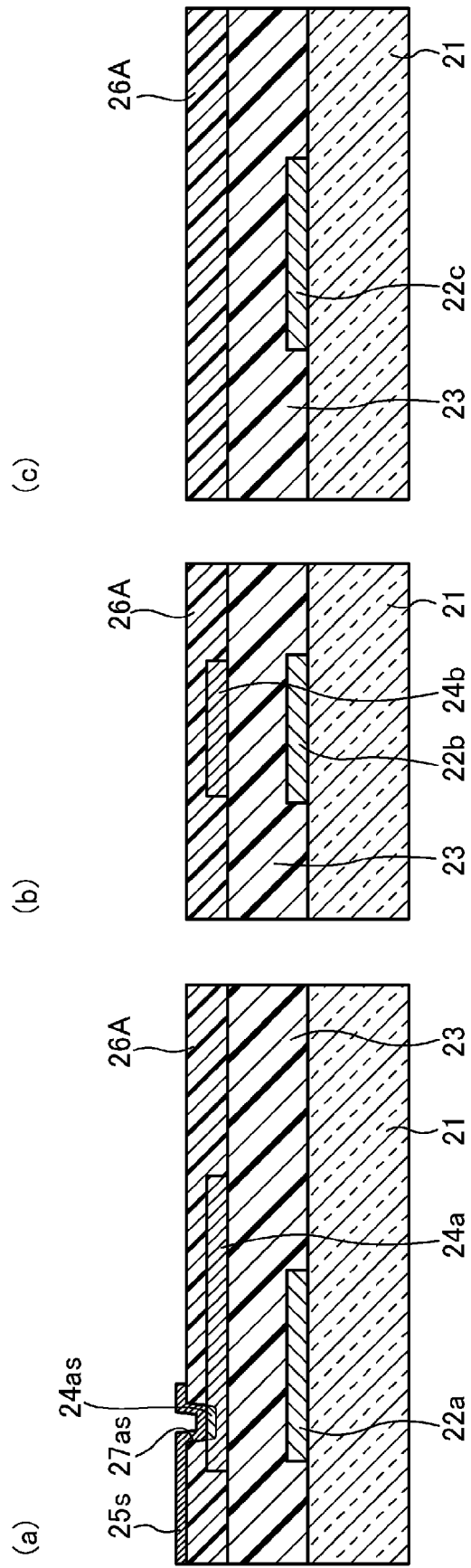
FIGS. 18A-18C are views illustrating a process step in the method for fabricating the thin film transistor substrate following the process step of FIGS. 17A-17C.
Figure 19:
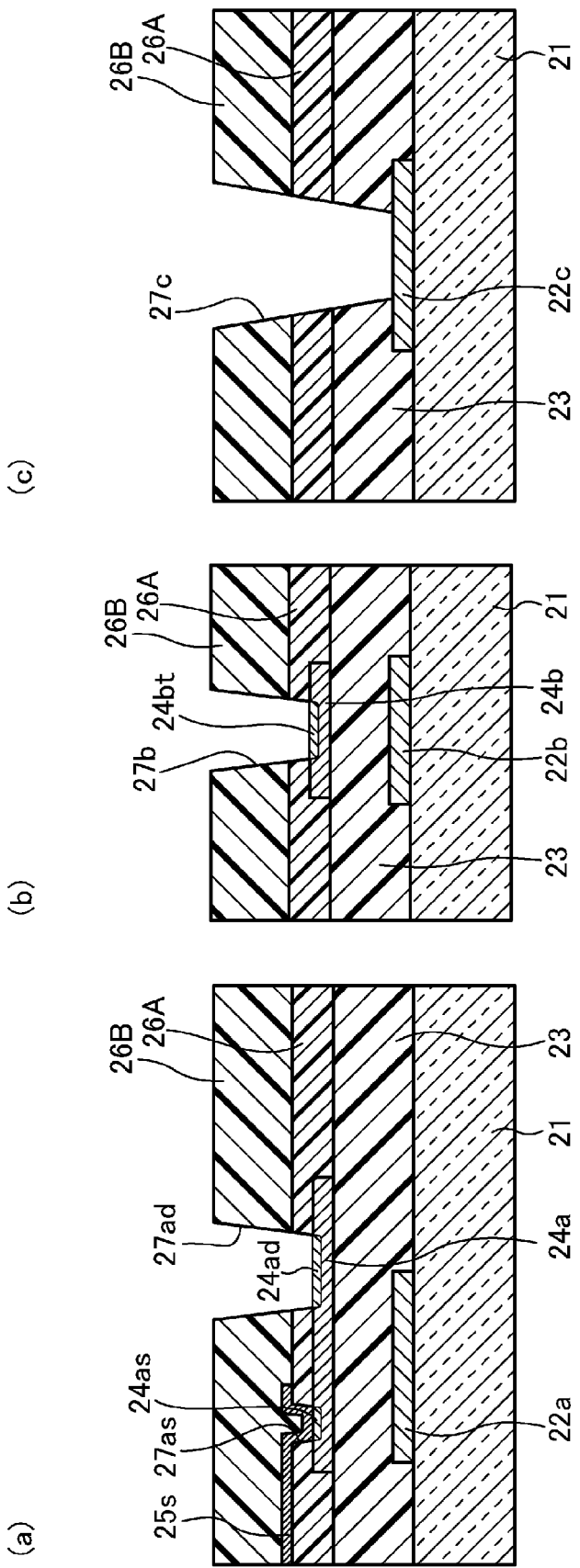
FIGS. 19A-19C are views illustrating a process step in the method for fabricating the thin film transistor substrate following the process step of FIGS. 18A-18C.
Figure 20:
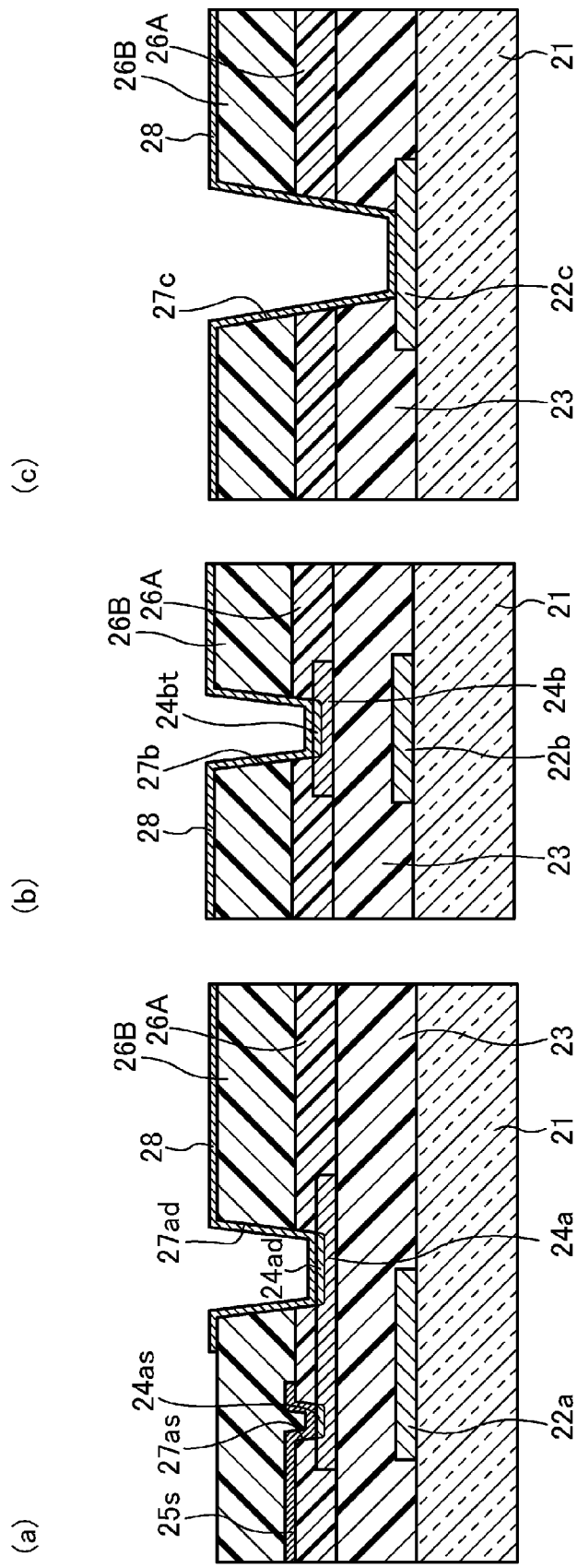
FIGS. 20A-20C are views illustrating a process step in the method for fabricating the thin film transistor substrate following the process step of FIGS. 19A-19C.

FIG. 15 is a cross-sectional view along the line C-C of FIG. 12.

As illustrated in FIG. 15, the terminal 22c is covered with the gate insulating film 23, the interlayer dielectric film 26A, and the protective film 26B. The terminal 22c is made of the first metal, and has a configuration in which, for example, an aluminum film, a titanium film, and a titanium nitride film are sequentially stacked from bottom to top.

A contact hole 27c is formed in the gate insulating film 23, the interlayer dielectric film 26A, and the protective film 26B to extend from the surface of the protective film 26 to the terminal 22c. An inner surface of the contact hole 27c is covered with the pixel electrode 28, and the pixel electrode 28 is electrically connected to the terminal 22c, thereby forming a gate terminal section $T_G$.

Note that FIG. 15 illustrates a cross section of the gate terminal section $T_G$, but a source terminal section $T_S$ also has a similar cross-sectional structure.

The liquid crystal display device 10 having the above-described configuration is configured such that each of pixel electrodes forms a pixel, and in each pixel, when the thin film transistor $T_R$ is turned on by a gate signal sent via the gate line 22gb, a source signal is sent via the source line 25sb, so that a predetermined charge is applied to the pixel electrode 28 via the source section S (the low resistance portion 24as and the source metal 25s) and the drain section DR (the low resistance portion 24ad), which causes a potential difference between the pixel electrode 28 and the common electrode of the counter substrate 30, thereby applying a predetermined voltage to a liquid crystal capacitor including the liquid crystal layer 50. The liquid crystal display device 10 displays an image by adjusting transmittance of light coming from the outside, based on the phenomenon that the alignment of liquid crystal molecules changes according to the magnitude of the applied voltage.

In the above description, the second metal, of which the source metal 25s, and the like of the TFT substrate 20 is made, has a configuration in which the first conductive film 25sp, the second conductive film 25sq, and the third conductive film 25sr are sequentially stacked. However, a configuration which does not include the third conductive film 25sr (that is, a configuration in which two layers, the first conductive film 25sp and the second conductive film 25sq are stacked) may be possible, or other configurations may be possible.

Moreover, in the above description, the second conductive film 25sq of the second metal, of which the source metal 25s, and the like of the TFT substrate 20 is made, is an aluminum film. However, for example, a film made of an aluminum alloy, a film made of copper (Cu) or made of a copper alloy, etc. may be used.

<Method for Fabricating TFT Substrate>

With reference to FIGS. 16A-20C, a method for fabricating the TFT substrate 20 of the present embodiment will be described below.

(Formation of First Metal, Gate Insulating Film, Oxide Semiconductor Film, Interlayer Insulating Film)

First, as illustrated in FIGS. 16A-16C, a first metal having a multilayer structure composed of an aluminum film, a titanium film, and a titanium nitride film is provided on a substrate 21 to form a gate electrode 22a, a lower electrode 22b, a terminal 22c, etc.

Next, as a gate insulating film 23, a $SiO_2$ film is formed by, for example, CVD.

Next, an oxide semiconductor film 24a and an etch stopper layer 24b are formed. Specifically, an oxide semiconductor film such as an IGZO film is formed by, for example, sputtering, and then a resist pattern is left by photolithography on portions which will be the oxide semiconductor film 24a and the etch stopper layer 24b. Then, the IGZO film is etched by, for example, wet etching using an oxalic acid solution as an etchant. After that, the resist is removed by a resist remover solution.

Moreover, above the gate insulating film 23, a $SiO_2$ film is formed as an interlayer insulating film 26A to cover the oxide semiconductor film 24a and the etch stopper layer 24b by, for example, CVD.

(Formation of Contact Hole•First Process of Reducing Resistance)

Subsequently, as illustrated in FIG. 17A, the interlayer insulating film 26A is dry etched, thereby forming a source contact hole 27as extending to the oxide semiconductor film 24a. A process of reducing resistance is performed on part of the oxide semiconductor film 24a which is exposed in the source contact hole 27as to reduce the resistance of the exposed part of the oxide semiconductor film 24a, thereby forming a low resistance portion 24as. The process of reducing resistance can be performed by the same methods as listed in the first embodiment. With this process of reducing resistance, a portion having a thickness of less than or equal to ½ of the thickness of the oxide semiconductor film 24a is formed into a low resistance portion 24ad having a resistance lower than that of the oxide semiconductor film 24a. The low resistance portion 24as obtained by reducing the resistance of part of the oxide semiconductor film 24a serves as a source section S.

Note that as illustrated in FIGS. 17B, 17C, here, no contact hole is formed in regions which will be an auxiliary capacitor element and a gate terminal section $T_G$.

(Formation of Second Metal)

Subsequently, as illustrated in FIG. 18A, a source metal 25s is formed to cover an inner surface of the source contact hole 27as. The source metal 25s can be formed, in a manner similar to that of the first embodiment. For example, a titanium film (having a thickness of about 50 nm) which will be a first conductive film 25sp, an aluminum film (having a thickness of about 150 nm) which will be a second conductive film 25sq, and a molybdenum nitride film (having a thickness of about 100 nm) which will be a third conductive film 25sr are successively formed by, for example, sputtering. Then, a resist pattern is left by, for example, photolithography on a portion which includes the source metal 25s. After that, the second conductive film and the third conductive film are etched by, for example, wet etching using a mixed acid solution of phosphoric acid/acetic acid/nitric acid as an etchant. Further, the titanium film which is the first conductive film is etched by dry etching (RIE) using a chlorine-based gas. Thereafter, the resist is removed by a resist remover solution, thereby forming the source metal 25s.

Note that a source line 25sb, and the like made of a second metal are formed simultaneously with the formation of the source metal 25s. As illustrated in FIGS. 18B, 18C, the second metal is not formed in regions which will be an auxiliary capacitor element Cs and the gate terminal section $T_G$.

(Formation of Protective Film, Contact Hole•Second Process of Reducing Resistance)

Next, as illustrated in FIGS. 19A-19C, a $SiO_2$ film is formed as a protective film 26B by, for example, CVD. Then, the protective film 26B and the interlayer insulating film 26A are simultaneously dry etched, thereby forming a pixel contact hole 27ad, an auxiliary capacitor contact hole 27b, and a contact hole 27c. As illustrated in FIGS. 19A, 19B, a process of reducing resistance is performed on parts of the oxide semiconductor film 24a and the etch stopper layer 24b which are respectively exposed in the pixel contact hole 27ad and the auxiliary capacitor contact hole 27b to reduce the resistance of portions including the exposed parts of the oxide semiconductor film 24a and the etch stopper layer 24b, thereby forming low resistance portions 24ad, 24bt. With this process of reducing resistance, a portion having a thickness of less than or equal to ½ of the thickness of the oxide semiconductor film 24a is formed into the low resistance portion 24ad having a resistance lower than that of the oxide semiconductor film 24a. Moreover, a portion having a thickness of less than or equal to ½ of the thickness of the etch stopper layer 24b is formed into the low resistance portion 24bt having a resistance lower than that of the etch stopper layer 24b. The low resistance portion 24ad formed by reducing the resistance of part of the oxide semiconductor film 24a serves as a drain section DR. Moreover, the low resistance portion 24bt formed by reducing the resistance of part of the etch stopper layer 24b serves as an upper electrode portion of an auxiliary capacitor element Cs.

(Formation of Pixel Electrode)

Finally, as illustrated in FIGS. 20A-20C, a pixel electrode 28 is formed in a manner similar to that of the first embodiment.

As described above, the TFT substrate 20 is fabricated. The TFT substrate 20 fabricated by the above-described method and the counter substrate 30 including pixels each provided with a color filter are arranged to face each other and are adhered to each other by the sealing material 40, and a liquid crystal material is filled between the substrates, thereby forming the liquid crystal layer 50, so that the liquid crystal display device 10 can be obtained.

(Advantages of Second Embodiment)

In the thin film transistor $T_R$ of the present embodiment, the pixel electrode 28 is in contact with and is electrically connected to the drain section DR in a manner similar to that of the first embodiment, which can reduce the occurrence of a contact failure between the pixel electrode 28 and the drain section DR.

In addition to the advantages obtained in the first embodiment, according to the configuration of the second embodiment, the source section S includes the low resistance portion 24as and the source metal 25s, so that contact of the source section S can also be ensured in the low resistance portion 24as even when the electrode area of the source metal 24as is reduced. Thus, satisfactory contact can be achieved. Therefore, the configuration of the second embodiment provides the advantage that the aperture ratio is increased by reducing the electrode area oft source metal 24as.

Third Embodiment

Configuration of Liquid crystal Display Device

Similar to the first embodiment, a liquid crystal display device 10 according to a third embodiment includes a TFT substrate 20 and a counter substrate 30 which are arranged to face each other. The substrates 20 and 30 are adhered to each other by a sealing material 40 arranged to have a frame-like shape at outer peripheral parts of the substrates 20 and 30. In the space surrounded by the sealing material 40 between the substrates 20 and 30, a liquid crystal layer 50 is provided as a display layer. The liquid crystal display device 10 has a display region D which is surrounded by the sealing material 40 and in which a plurality of pixels are arranged in a matrix pattern. A region by which the display region D is surrounded is a picture-frame region. The configurations, etc. of the counter substrate 30, the sealing material 40, and the liquid crystal layer 50 are the same as those of the first embodiment, and thus the description thereof is omitted.

(TFT Substrate)

Figure 21:
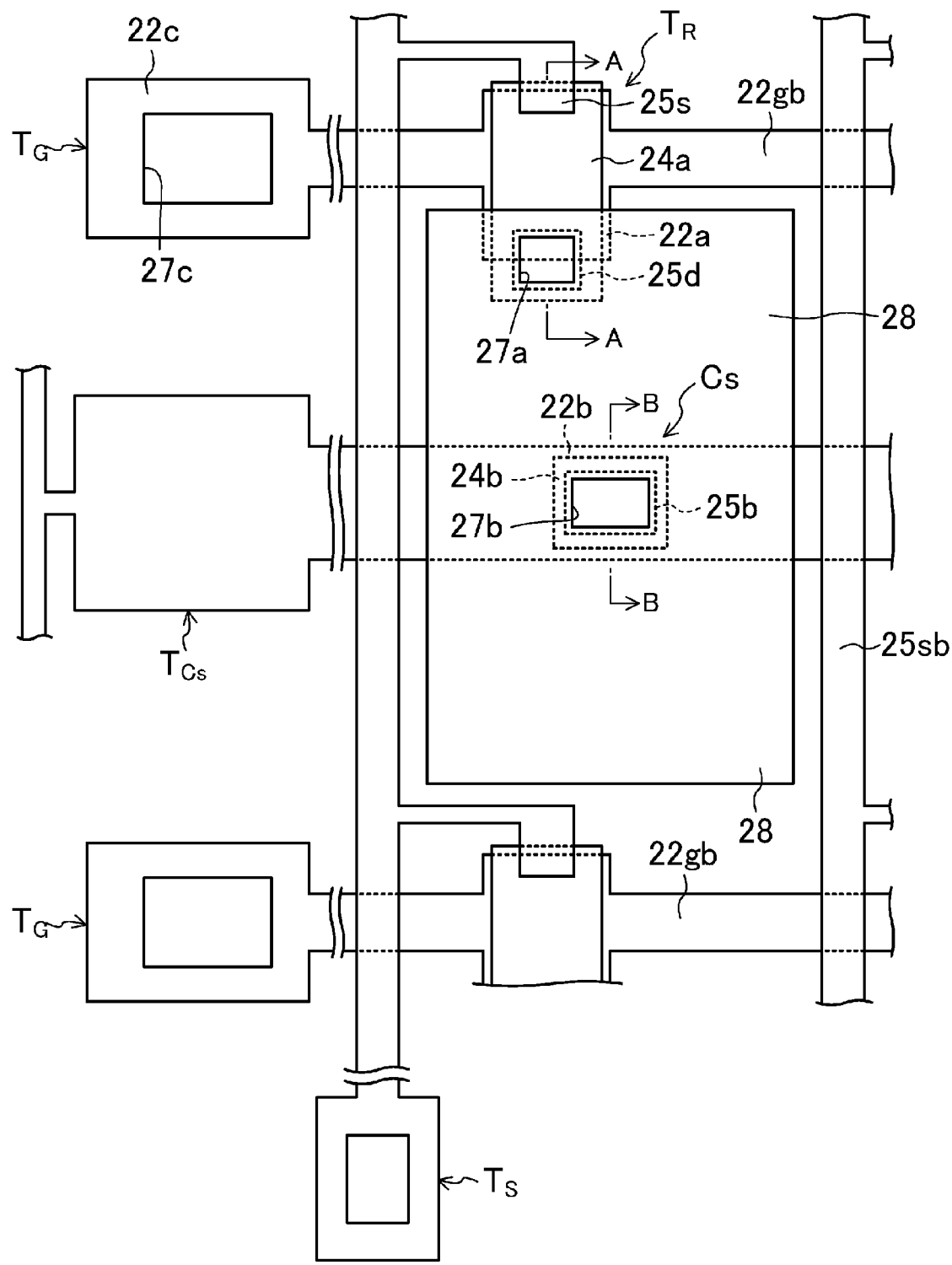
FIG. 21 is a plan view illustrating a substantial portion of a thin film transistor substrate according to a third embodiment in an enlarged manner.
Figure 22:
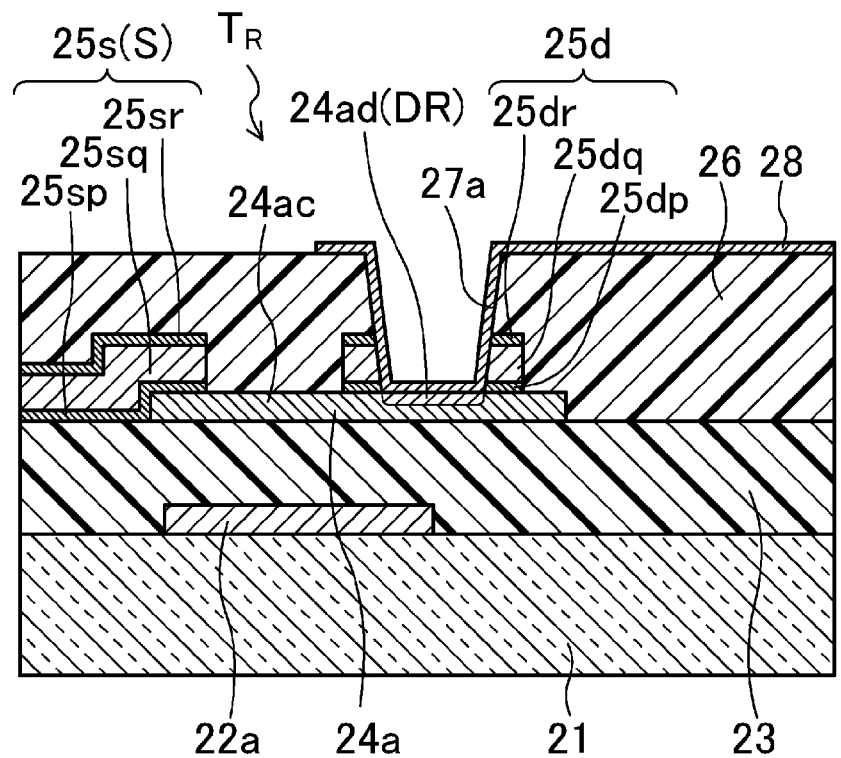
FIG. 22 is a cross-sectional view along the line A-A of FIG. 21.
Figure 23:
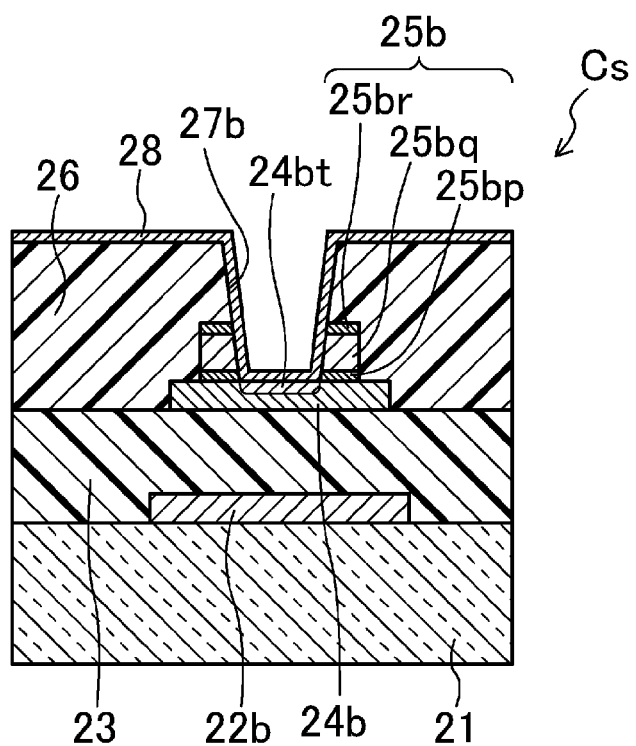
FIG. 23 is a cross-sectional view along the line B-B of FIG. 21.
Figure 24:
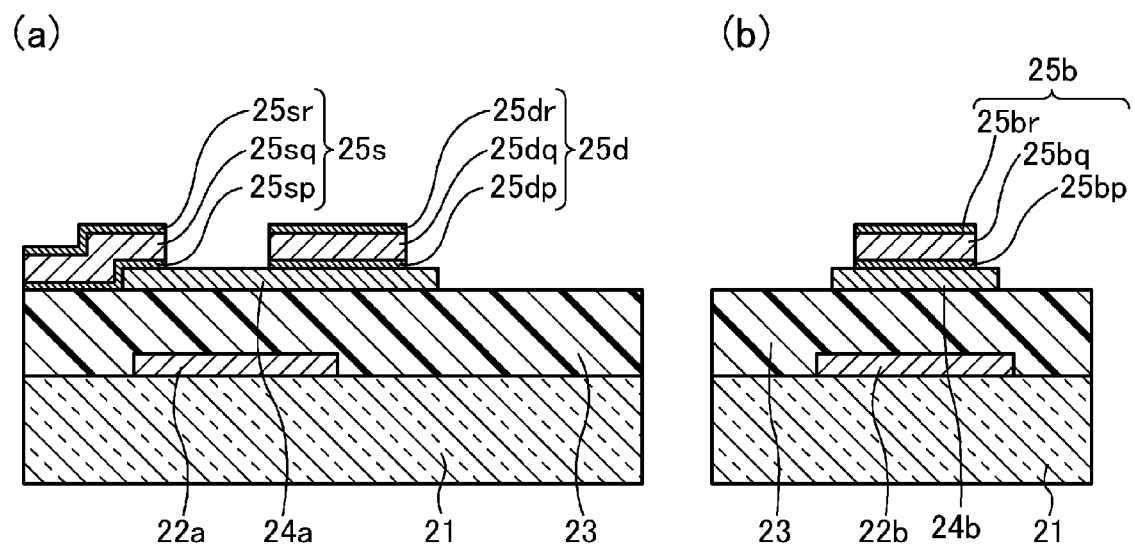
Figure 25:
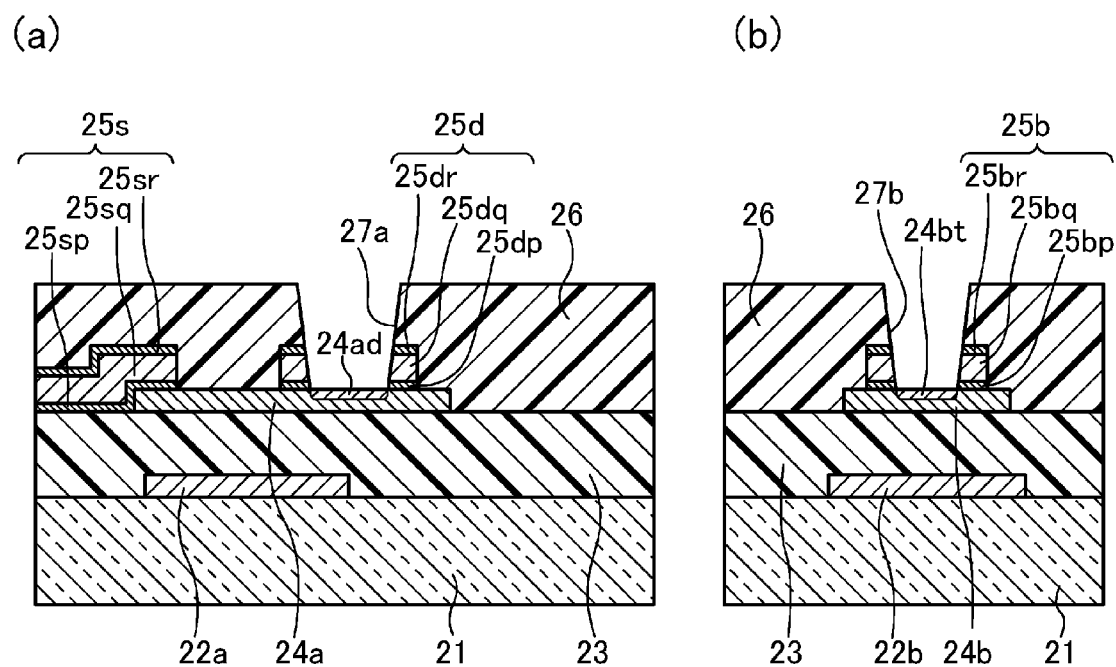
FIGS. 25A, 25B are views illustrating a process step in the method for fabricating for fabricating the thin film transistor substrate following the process step of FIGS. 24A, 24B.
Figure 26:
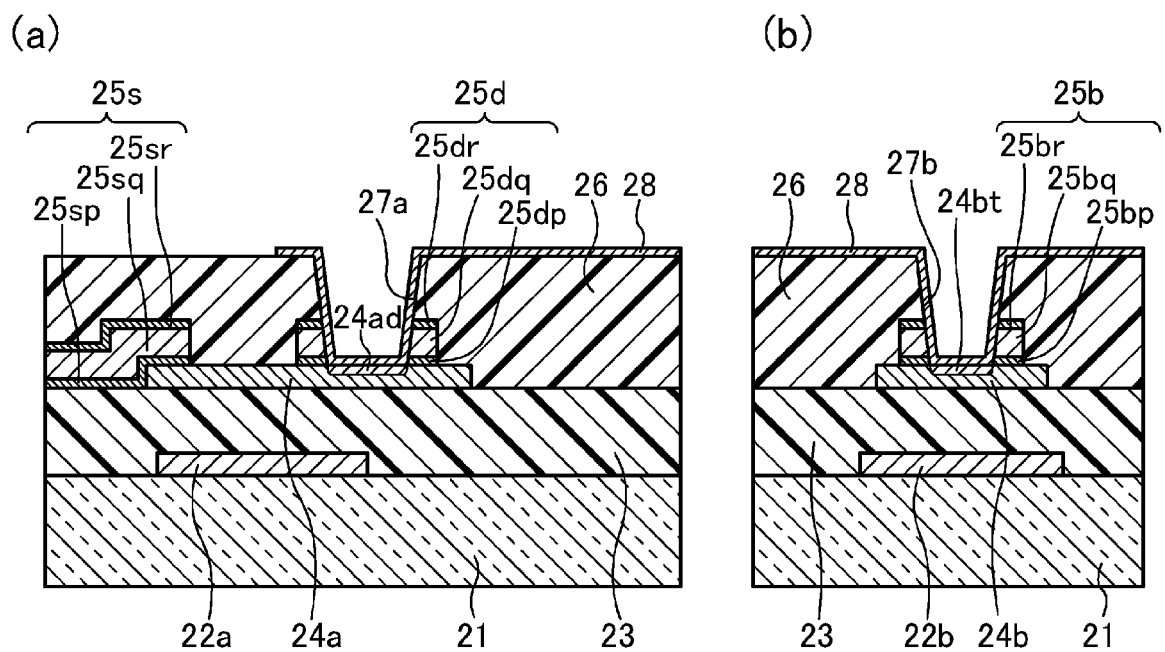
FIGS. 26A, 26B are views illustrating a process step in the method for fabricating the thin film transistor substrate following the process step of FIGS. 25A, 25B.

FIGS. 21-23 illustrate the TFT substrate 20 of the third embodiment. FIG. 21 is a plan view illustrating the TFT substrate 20. The TFT substrate 20 is formed, in a manner similar to that of the first embodiment, by stacking, on a substrate 21, a first metal (of which a gate electrode 22a, a lower electrode 22b, a terminal 22c, a gate line 22gb, transfer pads (not shown), etc. are made), a gate insulating film 23, oxide semiconductor films 24a, 24b, a second metal (of which a source metal 25s, a drain metal 25d, an upper metal 25b, a source line 25sb, etc. are made), a protective film 26, a pixel electrode 28, and an alignment layer (not shown).

FIG. 22 is a cross-sectional view along the line A-A of FIG. 21.

As illustrated in FIG. 22, the gate electrode 22a is covered with the gate insulating film 23, and on the gate insulating film 23, the oxide semiconductor film 24a including a channel section 24ac formed at a position facing the gate electrode 22a is provided, and on the oxide semiconductor film 24a, a source section S and a drain section DR are provided to be spaced apart from each other with the channel section 24ac sandwiched therebetween.

The gate electrode 22a is made of the first metal, and includes, for example, an aluminum film, a titanium film, and a titanium nitride film which are sequentially stacked from bottom to top.

The source section S is made of the source metal 25s provided above the gate insulating film 23 and the oxide semiconductor film 24a.

The source metal 25s is made of the second metal, and includes, similar to the first embodiment, for example, a first conductive film 25sp, a second conductive film 25sq, and a third conductive film 25sr which are sequentially stacked.

The drain section DR is a low resistance portion 24ad. The low resistance portion 24ad is a portion including part of the oxide semiconductor film 24a which is exposed in a pixel contact hole 27a, and the resistance of the portion is reduced.

The low resistance portion 24ad is the portion including the part of the oxide semiconductor film 24a which is exposed in the pixel contact hole 27a, and the resistance of the portion is reduced, and thus the portion has high conductivity leading to a resistivity of about $\frac{1}{10000000000}$ to $\frac{1}{100}$ of the resistivity of the channel section 24ac. The low resistance portion 24ad includes a surface of the oxide semiconductor film 24a, and preferably has a thickness of less than or equal to ½ of the thickness of the oxide semiconductor film 24a. The resistance value of the low resistance portion 24ad is not uniform, but for example, the resistance gradually increases from the surface of the oxide semiconductor film 24a toward the gate insulating film 23. Moreover, in FIG. 22, the low resistance portion 24ad is illustrated as a discrete portion defined by a line frame for convenience, but the low resistance portion 24ad is not necessarily a discrete portion as long as it is a portion of a region integrated with the oxide semiconductor film 24a.

Above the oxide semiconductor film 24a, the drain metal 25d is provided. The drain metal 25d is provided at the same level as the source metal 25s, and includes, for example, a first conductive film 25dp made of a titanium film, a second conductive film 25dq made of an aluminum film, and a third conductive film 25dr made of a molybdenum nitride film which are sequentially stacked.

The pixel contact hole 27a is formed in the protective film 26, and extends through the drain metal 25d to the oxide semiconductor film 24a. An inner surface of the pixel contact hole 27a is covered with the pixel electrode 28, and the pixel electrode 28 is electrically connected to the low resistance portion 24ad which is the drain section DR.

A thin film transistor $T_R$ of the present embodiment has the above-described configuration, and thus the pixel electrode 28 is directly in contact with and is electrically connected to the drain section DR, which can reduce the occurrence of a contact failure between the pixel electrode 28 and the drain section DR. In particular, when the drain metal 25d is formed as a multilayer structure composed of the first conductive film 25dp, the second conductive film 25dq, and the third conductive film 25dr, and the second conductive film 25dq is an aluminum film, the aluminum film is oxidized, and a surface of the aluminum film is covered with a passivation coating, which may cause unsatisfactory conduction between the drain metal 25*d* and the pixel electrode 28, thereby leading to a contact failure. However, the drain section DR is made of the low resistance portion 24*ad* obtained by reducing the resistance of part of the oxide semiconductor film 24*a*. Thus, the conduction between the pixel electrode 28 and the drain metal 25*d* can be ensured in the low resistance portion 24*ad*, so that satisfactory contact can be achieved.

FIG. 23 is a cross-sectional view along the line B-B of FIG. 23.

As illustrated in FIG. 23, the lower electrode 22*b* is covered with the gate insulating film 23, and on the gate insulating film 23, the etch stopper layer 24*b* made of an oxide semiconductor is provided at a position facing the lower electrode 22*b*. Above the etch stopper layer 24*b*, the upper metal 25*b* is provided. In the protective film 26 covering the etch stopper layer 24*b*, an auxiliary capacitor contact hole 27*b* extending through the upper metal 25*b* to the etch stopper layer 24*b* is formed. A low resistance portion 24*bt* is formed by reducing the resistance of a portion including part of the etch stopper layer 24*b* which is exposed in the auxiliary capacitor contact hole 27*b* compared to the resistance of the other portions. These components are included in an auxiliary capacitor element Cs.

The lower electrode 22*b* is made of the first metal, and includes for example, an aluminum film, a titanium film, and a titanium nitride film which are sequentially stacked from bottom to top. Note that the lower electrode 22*b* is connected to an auxiliary capacitor terminal $T_{Cs}$ provided in the terminal region.

The upper metal 25*b* is provided at the same level as the source metal 25*s* and the drain metal 25*d*, and includes, for example, a first conductive film 25*bp* made of a titanium film, a second conductive film 25*bq* made of the aluminum film, and a third conductive film 25*br* made of the molybdenum nitride film which are sequentially stacked.

An inner surface of the auxiliary capacitor contact hole 27*b* formed in the protective film 26 is covered with the pixel electrode 28. The pixel electrode 28 is in contact with and is electrically connected to the low resistance portion 24*bt* provided in the etch stopper layer 24*b*.

Note that cross sections of a gate terminal section $T_G$ and a source terminal section $T_S$ are not illustrated, but have configurations similar to those of the cross sections of the gate terminal section $T_G$ of the first embodiment (FIG. 6).

The liquid crystal display device 10 having the above-described configuration is configured such that each of pixel electrodes forms a pixel, and in each pixel, when the thin film transistor $T_R$ is turned on by a gate signal sent via the gate line 22*gb*, a source signal is sent via the source line 25*sb*, so that a predetermined charge is applied to the pixel electrode 28 via the source section S (the source metal 25*s*) and the drain section DR (the low resistance portion 24*ad*), which causes a potential difference between the pixel electrode 28 and the common electrode of the counter substrate 30, thereby applying a predetermined voltage to a liquid crystal capacitor including the liquid crystal layer 50. The liquid crystal display device 10 displays an image by adjusting transmittance of light coming from the outside, based on the phenomenon that the alignment of liquid crystal molecules changes according to the magnitude of the applied voltage.

In the above description, the second metal, of which the source metal 25*s*, the drain metal 25*d*, the upper metal 25*b*, etc. of the TFT substrate 20 are made, has a configuration in which the first conductive film 25*sp*, 25*dp*, 25*bp*, the second conductive film 25*sq*, 25*dq*, 25*bq*, and the third conductive film 25*sr*, 25*dr*, 25*br* are sequentially stacked. However, a configuration which does not include the third conductive film 25*sr*, 25*dr*, 25*br* (that is, a configuration in which two layers, the first conductive film 25*sp*, 25*dp*, 25*bp* and the second conductive film 25*sq*, 25*dq*, 25*bq* are stacked) may be possible, or other configurations may be possible.

Moreover, in the above description, the second conductive film 25*sq*, 25*dq*, 25*bq* of the second metal, of which the source metal 25*s*, the drain metal 25*d*, the upper metal 25*b*, etc. of the TFT substrate 20 are made, is an aluminum film. However, for example, a film made of an aluminum alloy, a film made of copper (Cu) or made of a copper alloy, etc. may be used.

<Method for Fabricating TFT Substrate>

With reference to FIGS. 24A-26B, a method for fabricating the TFT substrate 20 of the present embodiment will be described below.

(Formation of First Metal, Gate Insulating Film, Oxide Semiconductor Film, Second Metal)

First, as illustrated in FIGS. 24A, 24B, a first metal having a multilayer structure composed of, for example, an aluminum film, a titanium film, and a titanium nitride film is provided on a substrate 21 to form a gate electrode 22*a*, a lower electrode 22*b*, etc.

Next, as a gate insulating film 23, a $SiO_2$ film is formed by, for example, CVD.

Next, an oxide semiconductor film 24*a* and an etch stopper layer 24*b* are formed.

Subsequently, a second metal having a multilayer structure composed of a first conductive film, a second conductive film, and a third conductive film is formed so that a source metal 25*s* and a drain metal 25*d* are formed above the gate insulating film 23 and the oxide semiconductor film 24*a*, and an upper metal 25*b* is formed above the gate insulating film 23 and the etch stopper layer 24*b*. Here, the second metal is formed as a pattern by which a source line 25*sb*, and the like are formed simultaneously with the source metal 25*s*, the drain metal 25*d*, and the upper metal 25*b*.

(Formation of Protective Film, Contact Hole•Process of Reducing Resistance)

Next, as illustrated in FIGS. 25A, 25B, a $SiO_2$ film is formed as a protective film 26 by, for example, CVD. Then, the protective film 26 are dry etched, thereby forming a pixel contact hole 27*a*, an auxiliary capacitor contact hole 27*b*, and a contact hole 27*c* (see FIG. 21). Then, a process of reducing resistance is performed on parts of the oxide semiconductor film 24*a* and the etch stopper layer 24*b* which are respectively exposed in the pixel contact hole 27*a* and the auxiliary capacitor contact hole 27*b* to reduce the resistance of portions including the exposed parts of the oxide semiconductor film 24*a* and the etch stopper layer 24*b*, thereby forming low resistance portions 24*ad*, 24*bt*. The process of reducing resistance can be performed by methods similar to those listed as the process of reducing resistance in the first embodiment. With this process of reducing resistance, a portion having a thickness of less than or equal to ½ of the thickness of the oxide semiconductor film 24*a* is formed into the low resistance portion 24*ad* having a resistance lower than that of the oxide semiconductor film 24*a*. Moreover, a portion having a thickness of less than or equal to ½ of the thickness of the etch stopper layer 24*b* is formed into the low resistance portion 24*bt* having a resistance lower than that of the etch stopper layer 24*b*. The low resistance portion 24*ad* formed by reducing the resistance of part of the oxide semiconductor film 24*a* serves as a drain section DR. Moreover, the low resistance portion 24*bt* formed by reducing the resistance of part of the etch stopper layer 24b serves as an upper electrode portion of an auxiliary capacitor element Cs.

(Formation of Pixel Electrode)

Finally, as illustrated in FIGS. 26A, 26B, a pixel electrode 28 is formed in a manner similar to that of the first embodiment.

As described above, the TFT substrate 20 is fabricated. The TFT substrate 20 fabricated by the above-described method and the counter substrate 30 including pixels each provided with a color filter are arranged to face each other and are adhered to each other by the sealing material 40, and a liquid crystal material is filled between the substrates, thereby forming the liquid crystal layer 50, so that the liquid crystal display device 10 can be obtained.

(Advantages of Third Embodiment)

In the thin film transistor $T_R$ of the present embodiment, even when conductive performance at a surface of the drain metal 25d is degraded, the pixel electrode 28 is in contact with and is electrically connected to the drain section DR in a manner similar to that of the first embodiment, which can reduce the occurrence of a contact failure between the pixel electrode 28 and the drain section DR.

In addition to the advantages obtained in the first embodiment, in the configuration of the third embodiment, overetching of the protective film 26 in forming the pixel contact hole 27a and the auxiliary capacitor contact hole 27b can be reduced by the drain metal 25d and the upper metal 25b because the drain metal 25d is provided in the drain section DR, and the upper metal 25b is provided in the auxiliary capacitor element Cs. Thus, as a result, plasma damage to the oxide semiconductor film 24a or slight etching of the oxide semiconductor film 24a can be reduced.

INDUSTRIAL APPLICABILITY

The present invention is useful for thin film transistor substrates and liquid crystal display devices including the same.

DESCRIPTION OF REFERENCE CHARACTERS $T_R$ Thin Film Transistor
D Drain Section
S Source Section
10 Liquid Crystal Display Device
20 Thin Film Transistor Substrate (TFT Substrate)
21 Substrate
22a Gate Electrode
23 Gate Insulating Film
24a Oxide Semiconductor Film
24ac Channel Section
25a Oxide Semiconductor Film
25sp First Conductive Film
25sq Second Conductive Film
25sr Third Conductive Film
25s Source Metal
26, 26B Protective Film
26A Interlayer Insulating Film
27a, 27ad Pixel Contact Hole
27as Source Contact Hole
28 Pixel Electrode
30 Counter Substrate
50 Liquid Crystal Layer

The invention claimed is:

1. A thin film transistor substrate comprising:
a substrate;
a gate insulating film which is located to cover a gate electrode provided on the substrate;
a thin film transistor, including:
the gate electrode,
a portion of the gate insulating film,
an oxide semiconductor film provided on the gate insulating film and including a channel section located at a position opposing the gate electrode, and
a source section and a drain section spaced apart from each other with the channel section sandwiched therebetween;
a protective film which is provided to cover the thin film transistor and which includes a pixel contact hole extending to the drain section; and
a pixel electrode provided on the protective film and directly electrically connected to the drain section by directly contacting the drain section within the pixel contact hole, wherein
the source section is defined by metal layer positioned above both the gate insulating film and the oxide semiconductor film,
the drain section is defined by only a low resistance area of the oxide semiconductor film including a surface of the oxide semiconductor film opposite to the gate insulating film, a resistance of the low resistance area is reduced as compared to other remaining portions of the oxide semiconductor film, and
the low resistance area is provided at the pixel contact hole and has a total thickness which is ½ or less of a total thickness of an entirety of the oxide semiconductor film.

2. The thin film transistor substrate of claim 1, further comprising:
an interlayer insulating film provided above the gate insulating film and the oxide semiconductor film and under the protective film, wherein
the metal layer of the source section is positioned above the interlayer insulating film,
a source contact hole extending from a lower surface of the interlayer insulating film to an upper surface of the oxide semiconductor film is defined in the interlayer insulating film, and the metal layer of the source section is provided within the source contact hole to directly electrically connect the metal layer of the source section to the oxide semiconductor film, and
a portion of a surface of the oxide semiconductor film which is in contact with the metal layer of the source section has a reduced resistance as compared to the other remaining portions of the oxide semiconductor film.

3. The thin film transistor substrate of claim 1, wherein the metal layer of the source section includes:
a first conductive film, and
a second conductive film made of aluminum, and
the first conductive film is located on a surface of the gate insulating film and the second conductive film is located on a surface of the first conductive film.

4. The thin film transistor substrate of claim 3, wherein the first conductive film is made of titanium.

5. The thin film transistor substrate of claim 3, wherein the metal layer of the source section further includes a third conductive film located on a surface of the second conductive film opposite to the first conductive film.

6. The thin film transistor substrate of claim 1, wherein the oxide semiconductor film is an IGZO film.

7. A liquid crystal display device, comprising:
the thin film transistor substrate of claim 1;
a counter substrate arranged to face the thin film transistor substrate; and a liquid crystal layer provided between the thin film transistor substrate and the counter substrate.

* * * * *